United States Patent
Zhou et al.

(10) Patent No.: US 9,299,798 B2
(45) Date of Patent: Mar. 29, 2016

(54) SEMICONDUCTOR DEVICE AND METHODS FOR FORMING A SEMICONDUCTOR DEVICE

(71) Applicant: GLOBALFOUNDRIES Singapore Pte. Ltd., Singapore (SG)

(72) Inventors: Zhibiao Zhou, Singapore (SG); Yudi Setiawan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 81 days.

(21) Appl. No.: 14/091,291

(22) Filed: Nov. 26, 2013

(65) Prior Publication Data
US 2015/0145060 A1    May 28, 2015

(51) Int. Cl.
*H01L 29/76*    (2006.01)
*H01L 29/45*    (2006.01)
*H01L 21/8234*    (2006.01)
*H01L 29/423*    (2006.01)
*H01L 29/66*    (2006.01)
*H01L 27/115*    (2006.01)
*G11C 16/04*    (2006.01)

(52) U.S. Cl.
CPC ........ *H01L 29/45* (2013.01); *H01L 21/823418* (2013.01); *H01L 27/11521* (2013.01); *H01L 29/42344* (2013.01); *H01L 29/66825* (2013.01); *G11C 16/0433* (2013.01)

(58) Field of Classification Search
CPC ............ H01L 29/45; H01L 21/823418; H01L 27/088; H01L 21/823807; H01L 21/823814; H01L 21/823857; H01L 29/7835; H01L 29/665; H01L 29/66659; H01L 21/266; H01L 29/456; H01L 29/4933
USPC ......... 257/239, 252, 337, 368, 382, 296, 408, 257/476; 438/286, 303, 306, 239, 597
See application file for complete search history.

(56) References Cited

U.S. PATENT DOCUMENTS

| | | | | |
|---|---|---|---|---|
| 2003/0193064 | A1* | 10/2003 | Wu | 257/315 |
| 2007/0052038 | A1* | 3/2007 | Asada | 257/382 |
| 2009/0090948 | A1* | 4/2009 | Sato | 257/296 |
| 2011/0186933 | A1* | 8/2011 | Pendharkar et al. | 257/368 |
| 2014/0147982 | A1* | 5/2014 | Ogata et al. | 438/303 |
| 2014/0183630 | A1* | 7/2014 | Hao et al. | 257/337 |

* cited by examiner

*Primary Examiner* — Dung Le
(74) *Attorney, Agent, or Firm* — Horizon IP Pte. Ltd.

(57) ABSTRACT

Devices and methods of forming a device are disclosed. A substrate prepared with at least a first transistor and a second transistor is provided. Each of the first and second transistors includes a gate disposed on the substrate between first and second contact regions in the substrate. A silicide block layer is formed on the substrate and is patterned to expose portions of the first and second contact regions. Silicide contacts are formed in the exposed first and second contact regions. The silicide contacts are displaced from sides of the gates of the first and second transistors. A contact dielectric layer is formed and contacts are formed in the contact dielectric layer. The contacts are in communication with the silicide contacts in the contact regions.

21 Claims, 19 Drawing Sheets

SEMICONDUCTOR DEVICE AND METHODS FOR FORMING A SEMICONDUCTOR DEVICE

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by, for example, forming contacts in a dielectric layer using, for example, damascene technique. The damascene technique, for example, forms a via or contact hole in the dielectric layer. The via serves as a contact to a device.

As technology advances, it is desirable to increase the speed of the device without impacting its reliability. Thus, larger via contacts are desired to lower contact resistance to improve the speed and it is important for via contacts to be coupled properly with the underlying contact regions on the substrate. However, as devices continue to shrink, separation distance between adjacent devices as well as separation distance between silicide contacts on the contact regions and adjacent gates is also reduced. Although larger via contacts may lower contact resistance, it may also lead to contact to gate electrical shorts or bridging between adjacent gates. These phenomena adversely render the IC malfunction.

Existing methods to avoid the problems above are not efficient and suffer from several disadvantages. As such, it is desirable to provide a device which is devoid of the above-mentioned problem, thus increasing the reliability of the IC. It is also desirable to provide an efficient and cost effective process for forming the device.

SUMMARY

Embodiments generally relate to semiconductor devices and methods for forming a device. In one embodiment, a method for forming a device is disclosed. A substrate prepared with at least a first transistor and a second transistor is provided. Each of the first and second transistors includes a gate disposed on the substrate between first and second contact regions in the substrate. A silicide block layer is formed on the substrate and is patterned to expose portions of the first and second contact regions. Silicide contacts are formed in the exposed first and second contact regions. The silicide contacts are displaced from sides of the gates of the first and second transistors. A contact dielectric layer is formed and contacts are formed in the contact dielectric layer. The contacts are in communication with the silicide contacts in the contact regions.

In another embodiment, a method for forming a device is presented. The method includes providing a substrate prepared with at least a first transistor and a second transistor. Each of the first and second transistors includes a gate and contact regions of which contacts are to be formed. A silicide block layer is formed on the substrate and is patterned to expose portions of the contact regions. Silicide contacts are formed in the exposed portions of the contact regions. The silicide contacts are displaced from sides of the gates of the first and second transistors.

In yet another embodiment, a device is disclosed. The device includes a substrate prepared with at least a first transistor and a second transistor. Each of the first and second transistors includes a gate disposed on the substrate between first and second contact regions in the substrate. The device includes silicide contacts disposed on portions of the first and second contact regions. The silicide contacts are displaced from sides of the gates of the first and second transistors. A contact dielectric layer is disposed over the substrate covering the transistors. Contacts are disposed in the contact dielectric layer. The contacts are in communication with the silicide contacts in the contact regions.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. More particularly, some embodiments relate to memory devices, such as but not limited to non-volatile memory (NVM) devices or high voltage (HV) devices. Such devices, for example, can be incorporated into standalone memory devices, such as USB or other types of portable storage units, or ICs, such as microcontrollers or system on chips (SoCs). Other types of devices may also be useful. The devices or ICs can be incorporated into or used with, for example, consumer electronic products, or relate to other types of devices.

Figure 1A:
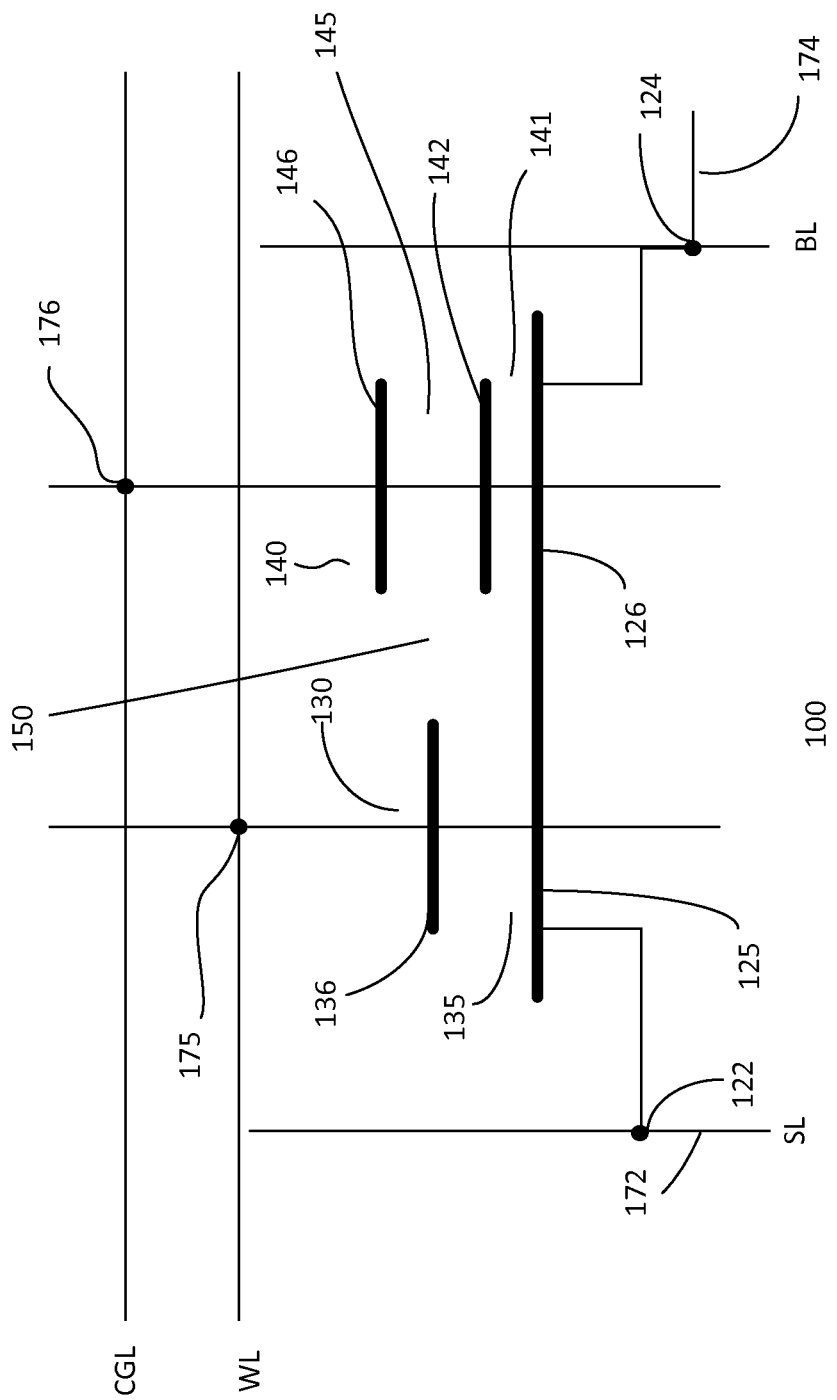
FIG. 1a shows a schematic diagram of an embodiment of a memory cell.

FIG. 1a shows a schematic diagram of an embodiment of a device. For illustration purpose, the device includes a memory cell 100. It is understood that the device may be other types of device, such as a high voltage (HV) device. Referring to FIG. 1a, in one embodiment, the memory cell is a non-volatile memory cell. In one embodiment, the memory cell includes a transistor with a gate disposed between first and second cell terminals 122 and 124. The gate is a split gate transistor. The split gate transistor, in one embodiment, includes a first gate 130 and a second gate 140. The first gate is adjacent to the first cell terminal and the second gate is adjacent to the second cell terminal. In one embodiment, the first gate is a select or access gate (SG) and the second gate is a memory gate (MG). The SG, for example, controls access to the memory cell while the MG is the storage node for storing data.

In one embodiment, the SG includes a SG gate electrode 136 over a SG gate dielectric 135. The SG is disposed over a first gate channel 125. The SG gate electrode may be polysilicon and the SG gate dielectric may be silicon oxide. Other types of gate electrode or gate dielectric materials may also be useful. For example, the gate electrode may be a metal gate electrode and the dielectric may be HfSiON, HfAlO, SiON, HfO$_2$, etc. The first gate electrode serves as a first gate terminal 175. For example, the first gate electrode serves as a SG gate terminal. As for the SG channel, it may be a crystalline semiconductor channel, such as a silicon channel.

The MG includes a first MG gate stacked over a second MG gate. The first MG gate, for example, is a control gate (CG) while the second MG gate is a floating gate (FG). The CG includes a CG electrode 146 and the FG includes a FG electrode 142. An intergate dielectric 145 separates the CG and FG electrodes while a FG dielectric 141 is disposed between the FG electrode and a second gate channel, such as a MG channel 126. The MG channel is a crystalline semiconductor channel, for example, similar to that of the SG channel. The first and second gate channels may be contiguous channels, forming a common channel for the gates. For example, the SG and MG channels are contiguous channels. The MG gate electrodes may be polysilicon gate electrodes while the intergate dielectric and the FG dielectric are dielectric materials, such as an oxide/nitride/oxide (ONO) stack and oxide respectively. Other suitable types of electrodes and dielectrics may also be useful. A gate spacer 150 is provided between the SG and MG. The gate spacer isolates the gate electrodes of the SG and MG. In one embodiment, the gate spacer may be a dielectric spacer, such as silicon oxide gate spacer. Other suitable types of dielectric materials, such as but not limited to oxide, SiN or SiON, may also be useful.

The cell terminals, for example, may be doped regions. The first cell terminal may be a source of the transistor and the second cell terminal may be a drain of the transistor. The source/drain (S/D) regions may be doped with first polarity type dopants. In one embodiment, the S/D regions are heavily doped with first polarity type dopants. The first polarity type dopants may be n-type, forming a memory cell with an n-type transistor. Alternatively, the first polarity type dopants may be p-type for forming a p-type memory cell. P-type dopants can include boron (B), aluminum (Al), indium (In) or a combination thereof, while n-type dopants can include phosphorus (P), arsenic (As), antimony (Sb) or a combination thereof.

In one embodiment, a first terminal line 172 is coupled to the first cell terminal and a second terminal line 174 is coupled to the second cell terminal. The first terminal line serves as a source line (SL) and the second terminal line serves as a bitline (BL). First and second gate lines are coupled to the first and second gates. For example, the first gate electrode or terminal 175 is coupled to a first gate line and the second gate electrode or terminal 176 is coupled to a second gate line. In one embodiment, the first gate line is a wordline (WL) and the second gate line is a CG line (CGL). Other configurations of BLs, WLs, SLs and CGLs may also be useful.

Figure 1B:
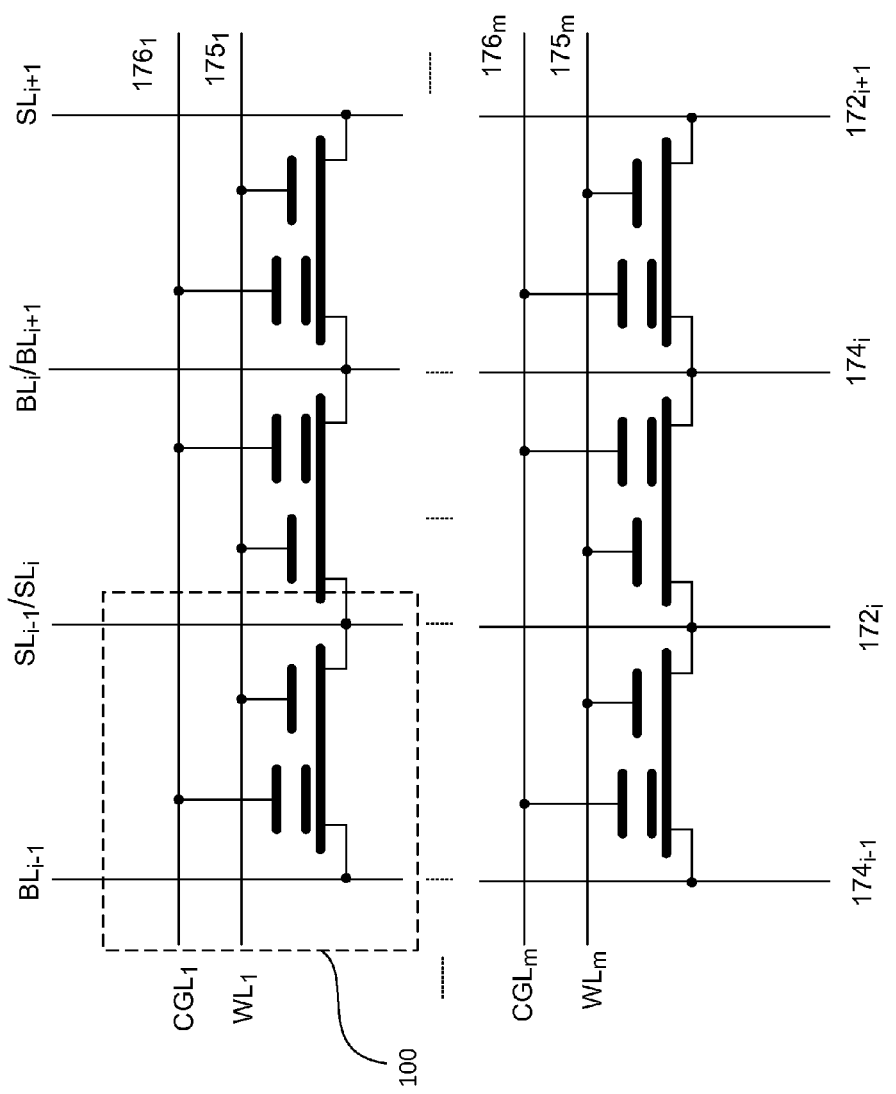
FIG. 1b shows an embodiment of a memory array.

A plurality of memory cells may be interconnected by SLs, BLs, WLs and CGLs to form a memory array. A portion of the memory array 103 is shown in FIG. 1b. The array includes a plurality of memory cells 100, as described in FIG. 1a. Common elements may not be described or described in detail. The array includes n BLs, n SLs, m WLs and m CGLs, forming an array having m rows and n columns of memory cells. The portion shows the first and last rows of memory cells and the $i^{th}$, $i^{th}+1$ and $i^{th}-1$ columns of memory cells. Adjacent memory cells share a common cell terminal. For example, adjacent memory cells are mirrored. As shown, $i^{th}$ and $i^{th}-1$ columns share a common SL while the $i^{th}$ and $i^{th}+1$ columns share a common BL. The memory cells may be configured as NAND or NOR cells, depending on design and operation requirements. Configuring the memory cells in other arrangements may also be useful.

Figure 2:
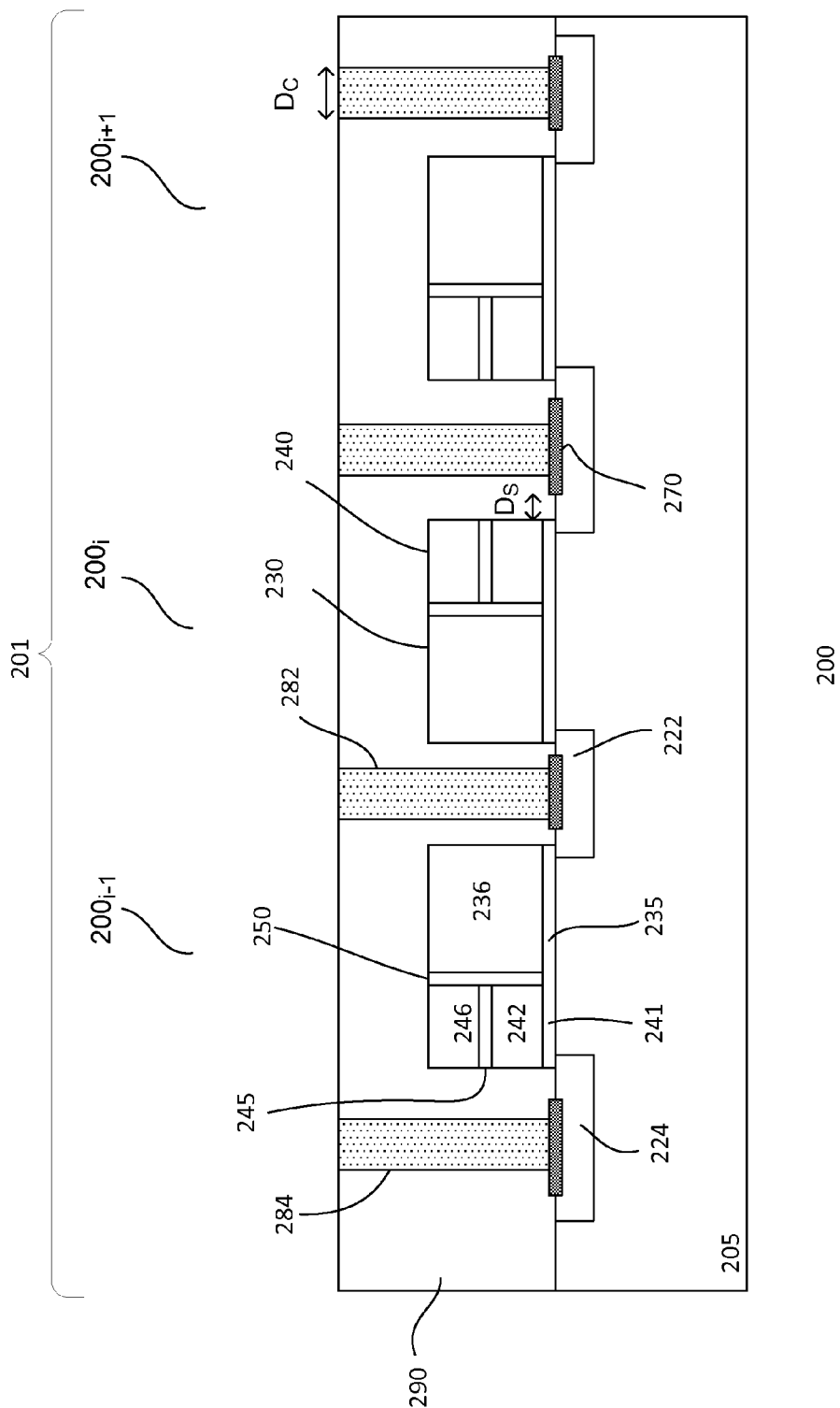
FIG. 2 shows cross-sectional view of an embodiment of a device.

FIG. 2 shows a cross-sectional view of an embodiment of a device 200 within a device region 201. For illustration purpose, the portion of the device as shown includes memory cells $200_{i-1}$, $200_i$ and $200_{i+1}$. The memory cells, for example, are part of an array region having a plurality of memory cells. For example, the memory cells are adjacent memory cells of a row of memory cells of a memory array. It is understood that the portion of the device may be other types of devices, such as but not limited to HV devices. The substrate 205 may also include other types of device regions (not shown). For example, the substrate may include a support region (not shown) for devices for accessing the memory array. Additional device regions, such as logic regions, may also be provided. The substrate may include regions for other types of circuitry, depending on the type of device or IC.

The substrate, for example, is a semiconductor substrate, such as a silicon substrate. For example, the substrate may be a lightly doped p-type substrate. Providing an intrinsic or other types of doped substrates such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

A memory cell includes a transistor with a gate disposed between first and second doped regions 222 and 224. The doped regions include first polarity type dopants, forming a first polarity type memory cell. For example, n-type dopants may be provided in the doped regions for a n-type memory cell or p-type dopants may be provided in the doped regions for a p-type memory cell. P-type dopants can include boron (B), aluminum (Al), indium (In) or a combination thereof, while n-type dopants can include phosphorus (P), arsenic (As), antimony (Sb) or a combination thereof. In one embodiment, the doped regions are heavily doped first polarity type regions. The doped regions serve as source and drain regions. For example, the first doped region serves as a source region of the memory cell while the second doped region serves as a drain region of the memory cell.

As for the gate, it is a split gate. The split gate, in one embodiment, includes a first gate 230 and a second gate 240. The first gate is adjacent to the first cell terminal and the second gate is adjacent to the second cell terminal. In one embodiment, the first gate is a select or access gate (SG) and the second gate is a memory gate (MG). The SG, for example, controls access to the memory cell while the MG is the storage node for storing data.

In one embodiment, the SG includes a SG gate electrode 236 over a SG gate dielectric 235. The SG is disposed on the substrate. The SG gate electrode may be formed of polysilicon and the SG gate dielectric may be formed of silicon oxide. Other types of gate electrode or gate dielectric materials may also be useful. For example, the gate electrode may be a metal gate electrode and the dielectric may be HfSiON, HfAlO, SiON, HfO$_2$, etc.

The MG includes a first MG gate stacked over a second MG gate. The first MG gate, for example, is a control gate (CG) while the second gate is a floating gate (FG). The CG includes a CG electrode 246 and the FG includes a FG electrode 242. An intergate dielectric 245 separates the CG and FG electrodes while a FG dielectric 241 is disposed between the FG electrode and the substrate. The substrate below the gates serves as a channel for the transistor. The MG gate electrodes may be polysilicon gate electrodes while the intergate and FG gate dielectrics include dielectric materials, such as an ONO stack and oxide respectively. Other suitable types of electrodes and dielectrics may also be useful. A gate spacer 250 is provided between the SG and MG. The gate spacer isolates the gate electrodes of the SG and MG. In one embodiment, the gate spacer may be a silicon oxide gate spacer. Other suitable types of dielectric materials, such as but not limited to oxide, SiN or SiON, may also be useful.

The split gate may be a split gate conductor. For example, the split gate is a common gate for a column of memory cells. In the case shown, the split gates may correspond to the $i^{th}-1$, $i^{th}$, and $i^{th}+1$ columns of memory cells of an array. In one embodiment, adjacent gates of a row share either a common source region or a common drain region. Other configurations, such as non-common source and/or non-common drain regions may also be useful.

A dielectric layer 290 is disposed over the substrate covering the memory cells. The dielectric layer, for example, is a silicon oxide layer. Other types of dielectric materials including SiN, SiON, low temperature oxide (LTO), etc., may also be useful. The dielectric layer serves as a contact or pre-metal dielectric layer in which contacts are formed to contact regions of the substrate. Referring to FIG. 2, contacts are formed to contact regions of the substrate. In one embodiment, SL contacts 282 and BL contacts 284 are formed to contact regions of the substrate. The SL contacts are disposed in the dielectric layer in communication with the source or first doped regions; the BL contacts are disposed in the dielectric layer in communication with the drain or second doped regions. Additionally, WL contacts (not shown) are coupled to the SGs and CGL contacts (not shown) are coupled to the CGs. The dimension of the contacts Dc, for example, may be about 60 nm. Other suitable contact dimensions may also be useful, depending on technology node and design requirements.

The BL contacts are coupled to BLs, SL contacts are coupled to SLs, WL contacts are coupled to WLs and CGL contacts are coupled to CGLs. The various lines are disposed in one or more metal levels above the contact level. For example, BLs and SLs are disposed on one metal level while the WLs and CGLs are disposed on another metal level. The BLs and SLs run, for example, along the column direction while the WLs and CGLs run along a row direction. Other configurations of gate lines may also be useful.

Silicide contacts are disposed on the first and second doped regions 222 and 224. The silicide contacts, for example, may be nickel-based silicide contacts. Other types of metal-based silicide contacts, such as but not limited to titanium or cobalt based silicide contacts may also be useful. In one embodiment, silicide contacts for MG 240 and SG 230 are disposed at, for example, the edge of the cell having sufficiently wide area of which shorting of adjacent contacts are less likely to occur. As such, silicide contacts over the gates are not shown within the cell area in this cross-sectional view of FIG. 2. However, it is understood that silicide contacts may be provided over the gates within the cell area, depending on circuit routine design.

In one embodiment, the silicide contacts 270 occupy only a central region of the contact regions as shown in FIG. 2. For example, the silicide contacts are displaced from sides of the gates of the split gates. The displacement from sides of gates should be sufficient to prevent bridging with the gates. For example, the displacement should be sufficient to prevent silicide contacts on the drain regions from shorting adjacent CGs and FGs and silicide contacts on the source regions from shorting with adjacent SGs. In one embodiment, the displacement distance Ds is about 0.5 to 2 times the contact dimension. For example, for a contact dimension Dc of about 60 nm, the displacement distance Ds may range from about 30 to 120 nm. Preferably, the displacement distance Ds, for example, is about 1.5 times the contact dimension. For example, longer displacement distance Ds may be applicable for high voltage operation. Providing other displacement distances may also be useful, depending on the technology node, design and operation requirements.

It should be noted that the bigger the contact dimension Dc, the lower the contact resistance. For the same cell design, a larger Dc will result in a smaller Ds. However, the Ds should not be too small to result in bridging to adjacent gates while the Dc should be sufficiently large to have the desired contact resistance. The displacement distance Ds, for example, may depend on design requirements, such as resistance of the contact link. The resistance, for example, may be less than 500 Ω/link. Other resistance requirements may also be useful.

By providing silicide contacts as described above, contact resistance is advantageously reduced without the risk of shorting with adjacent gates. Furthermore, resistance reduction is achieved with larger contact dimensions without increasing the surface area of the cell. Although embodiments are described in the context of NVM cells, providing silicide contacts which is displaced from the gates may also be useful for other types of devices including HV devices, etc. For example, such silicide types of contacts are particularly useful in the case where shorting is a risk.

Figure 3A:
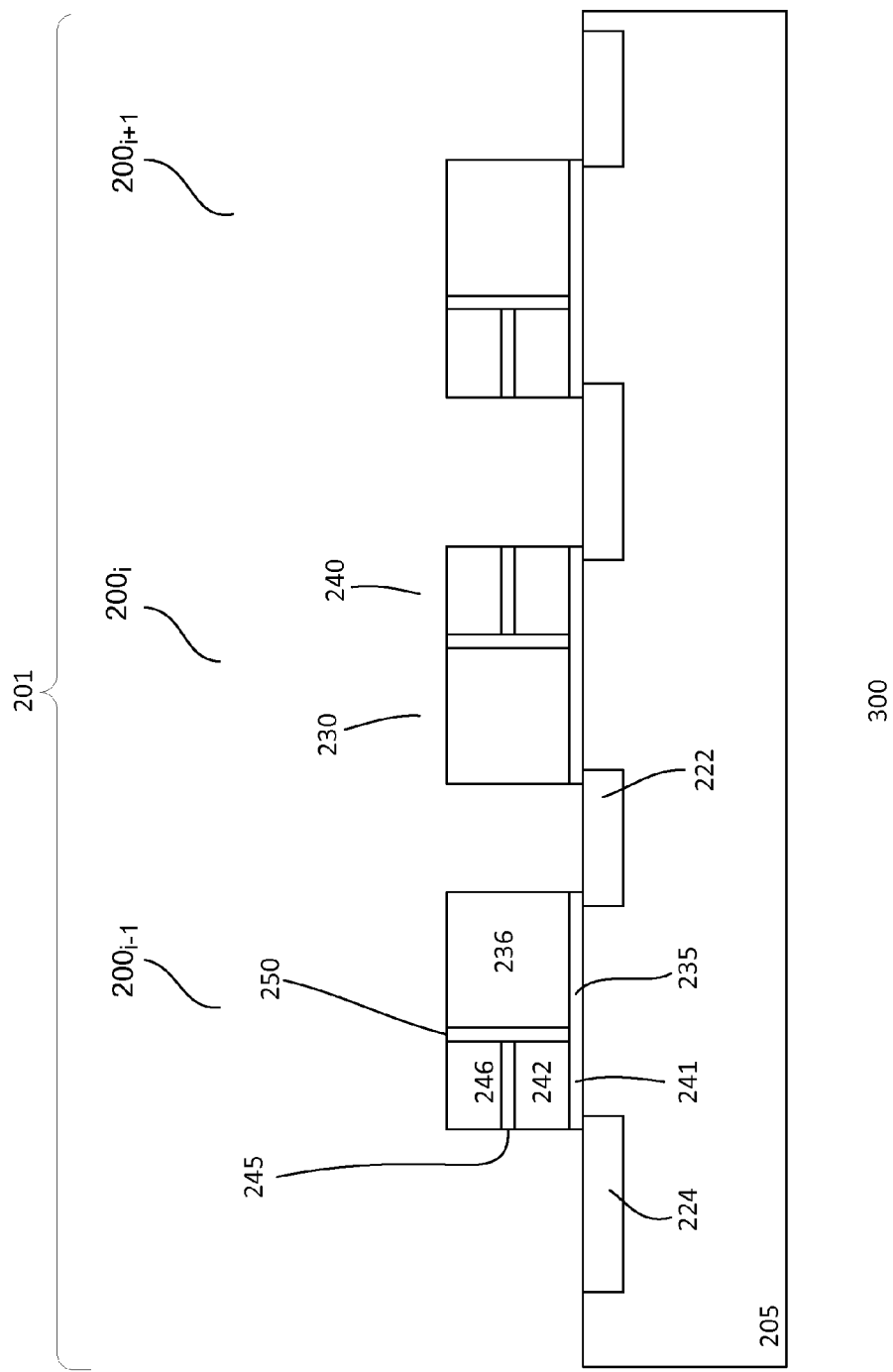
FIGS. 3a-3h show cross-sectional views of an embodiment of a process for forming a device.

FIGS. 3a-3h show an embodiment of a process 300 for forming a device. The device is similar to that described in FIGS. 1a-1b and 2. Common elements may not be described or described in detail. Referring to FIG. 3a, a substrate 205 is provided. The substrate 205, for example, is a semiconductor substrate, such as a silicon substrate. For example, the substrate may be a lightly doped p-type substrate. Providing an intrinsic or other types of doped substrates such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

For illustration purpose, the device region 201 of the substrate includes a plurality of memory cells. For example, the device region of the substrate shown includes memory cells 200$_{i-1}$, 200$_i$ and 200$_{i+1}$. The memory cells, for example, are part of an array region having a plurality of memory cells. For example, the memory cells are adjacent memory cells of a row of memory cells of a memory array. It is understood that the device may be other types of device, such as but not limited to HV device. The substrate may include other types of device regions (not shown). For example, the substrate may include a support region (not shown) for devices for accessing the memory array. Additional device regions, such as logic regions, may also be provided. The substrate may include regions for other types of circuitry, depending on the type of device or IC.

A memory cell includes a transistor with a gate formed between first and second doped regions 222 and 224. The first doped region, for example, serves as a source region while the second doped region serves as a drain region. As for the gate, it is a split gate. The split gate, in one embodiment, includes a first gate 230 and a second gate 240. The first gate is adjacent to the first cell terminal and the second gate is adjacent to the second cell terminal. In one embodiment, the first gate is a select or access gate (SG) and the second gate is a memory gate (MG).

In one embodiment, the SG includes a SG gate electrode 236 over a SG gate dielectric 235. The MG includes a first MG gate stacked over a second MG gate. The first MG gate, for example, is a control gate (CG) while the second gate is a floating gate (FG). The CG includes a CG electrode 246 and the FG includes a FG electrode 242. An intergate dielectric 245 separates the CG and FG electrodes while a FG dielectric 241 is disposed between the FG electrode and the substrate. A gate spacer 250 is provided between the SG and MG. The gate spacer isolates the gate electrodes of the SG and MG. In one embodiment, the gate spacer may be a silicon oxide gate spacer. Other types of dielectric materials may also be useful.

The memory cells, as described above, may be formed by any suitable techniques. For example, various dielectric or gate layers may be provided over the substrate and processed or patterned to form the memory cells and suitable techniques are applied to form the doped regions. As such, details of these process steps will not be described.

The split gate may be a split gate conductor. For example, the split gate is a common gate for a column of memory cells. In the case shown, the split gates may correspond to the $i^{th}-1$, $i^{th}$, and $i^{th}+1$ columns of memory cells of an array. In one embodiment, adjacent gates of a row share either a common source region or a common drain region. Other configurations, such as non-common source and/or non-common drain regions may also be useful.

Figure 3B:
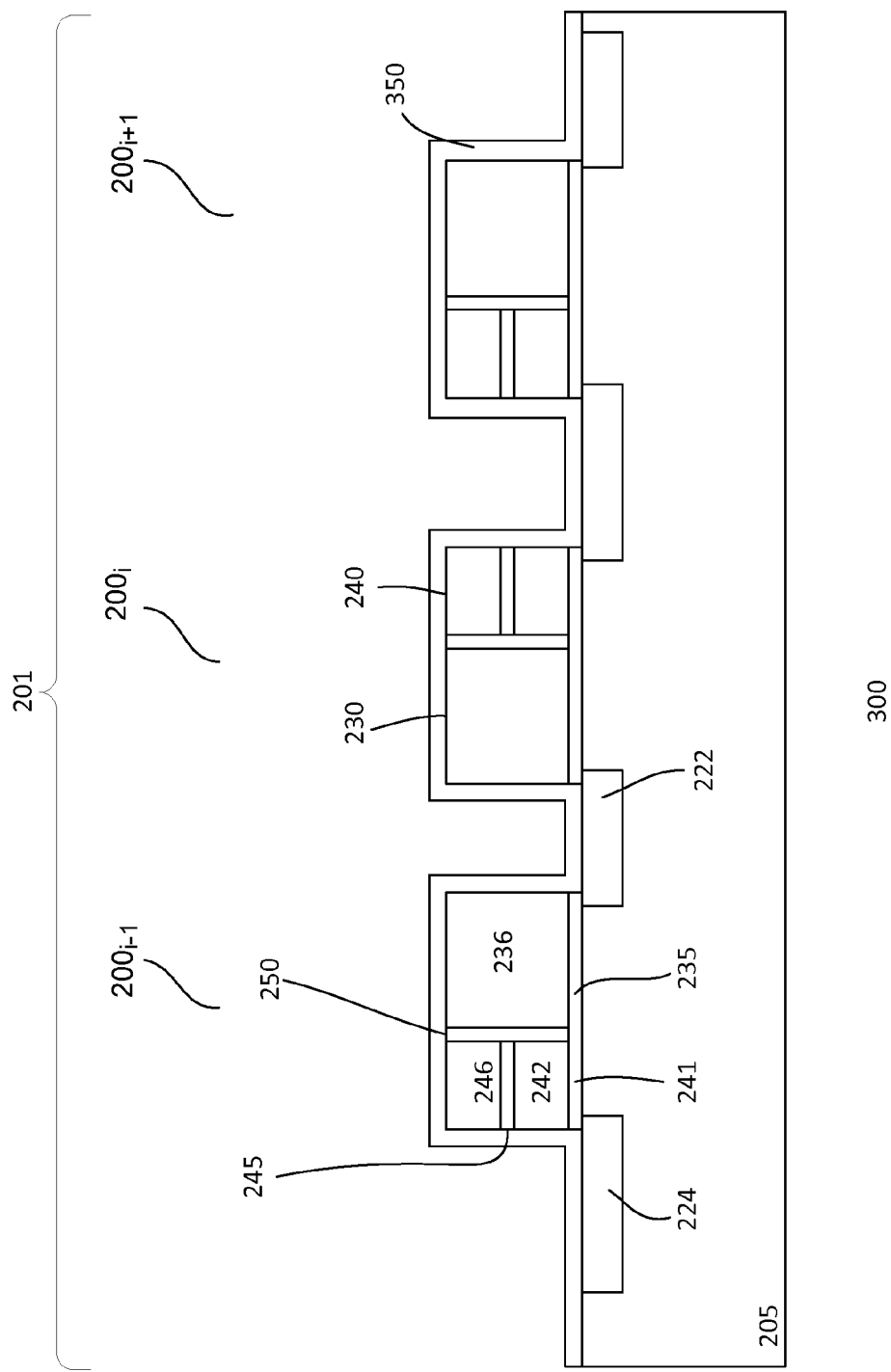

Referring to FIG. 3b, silicide block layer 350 is formed on the substrate. For example, the silicide block layer is formed over the device region 201 of the substrate, covering the first and second gates as well as the surfaces of the doped regions. The silicide block layer is formed of a material which prevents silicide formation. For example, the silicide block layer may be a dielectric material. In one embodiment, the silicide block layer may include a single layer. For example, the single silicide block layer may be a nitride, oxide, or oxynitride layer. The silicide block layer, for example, includes SiN, SiFt or SiON. In other embodiments, the silicide block layer may include more than one layer, forming a silicide block stack. For example, the silicide block stack includes a nitride/oxide stack. Providing other suitable types of materials or configurations for the silicide block layer may also be useful. The silicide block layer is formed on the substrate using a deposition process, such as chemical vapor deposition. Other suitable types of techniques may also be employed. The thickness of the silicide block layer, for example, is about 50-500 Å. Other suitable thickness ranges may also be useful, depending on technology node.

Figure 3C:
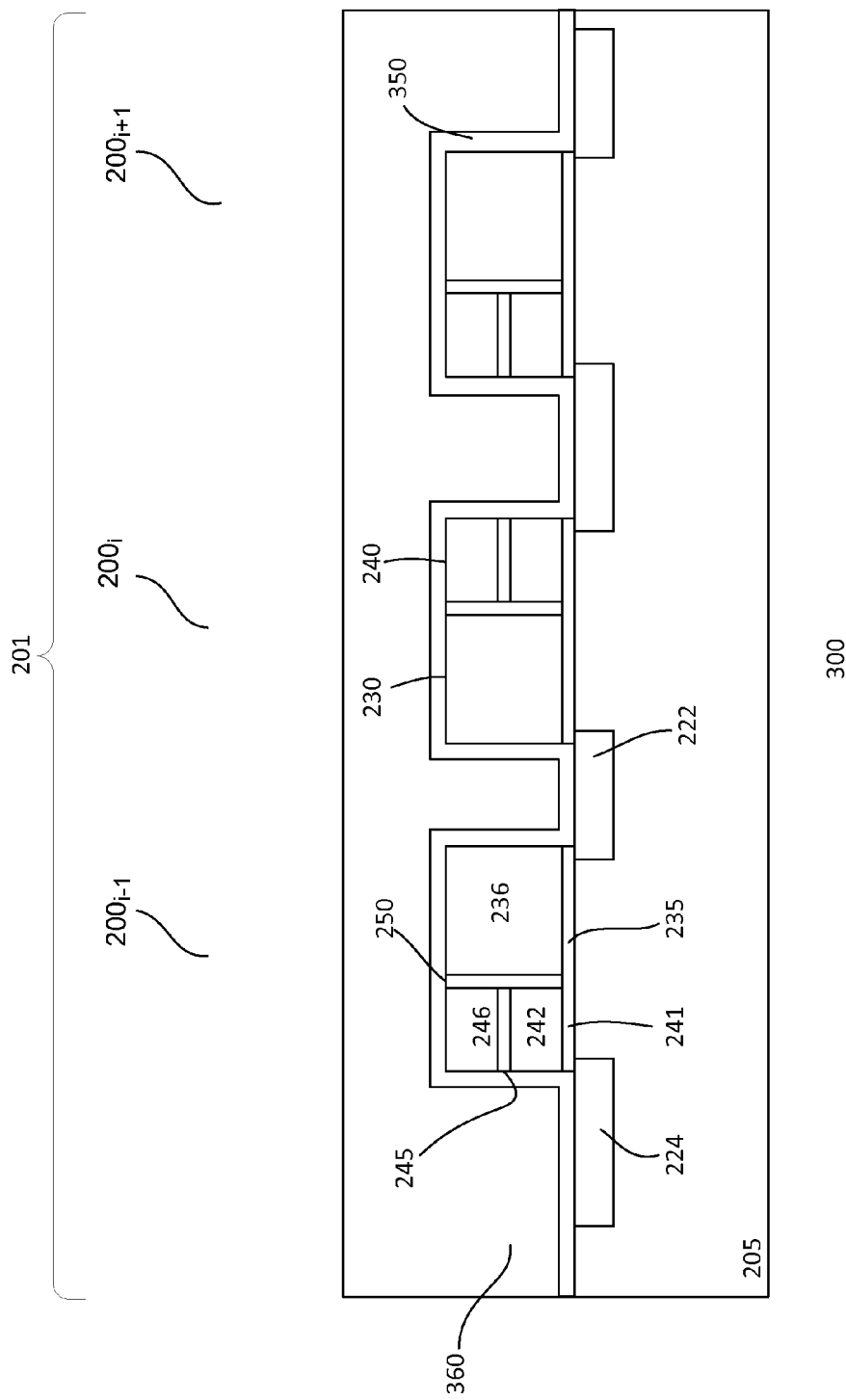

The process continues to form a thick dielectric or resist layer 360 over the substrate as shown in FIG. 3c. In one embodiment, the process continues to form an optical dispersive (OD) layer 360 using any suitable techniques, such as but not limited to spin-on technique. The OD layer sufficiently covers the silicide block layer and the memory cells. The OD layer, for example, includes a thickness $T_1$ which is about 1.5-2 times the height of the FG. Other suitable thickness ranges may also be useful, so long as the OD layer is sufficiently thick to cover high step height array topography. In one embodiment, the OD layer includes materials suitable for high wavelength exposure source. The OD layer, for example, includes a photo-resistant organic polymer or an etch type organic compound. For example, the OD layer includes photoresist (PR), bottom anti-reflective coating (BARC) material, etc. The OD layer, for example, is a self-planarizing layer. Although the top surface of the OD layer is illustrated as planar, it is understood that there may be a slight topography caused by the underlying memory cells. For example, the OD layer may be substantially planar due to the underlying topography.

Figure 3D:
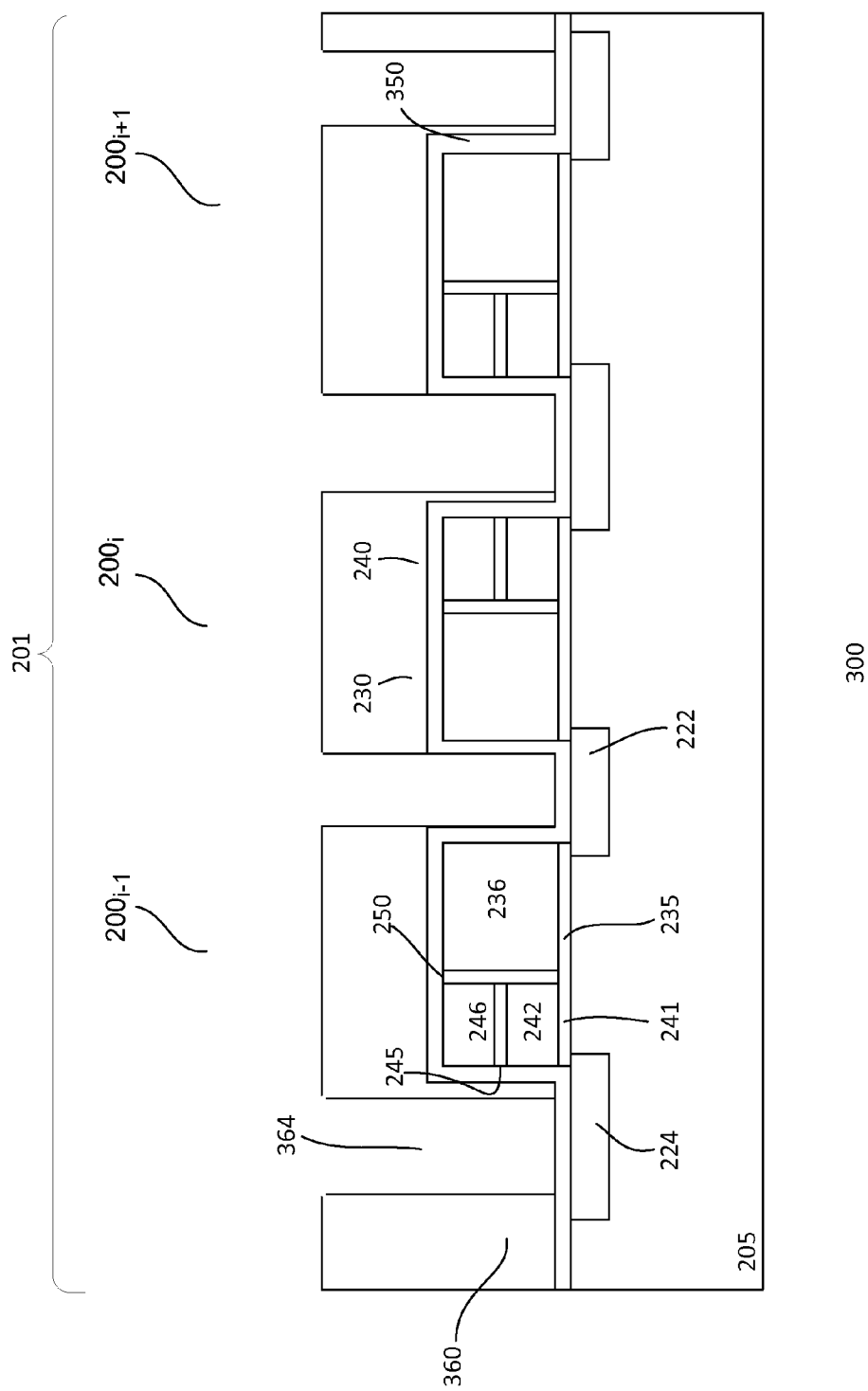

In FIG. 3d, the OD layer 360 is patterned to form openings 364. The openings, for example, correspond to contact regions of the memory cells. In one embodiment, the opening may be a block opening, traversing a column of memory cells. Also, the opening may expose the non-array region of the device. For example, the opening may expose the logic or low voltage device region of the device. The width of the openings 364 may be about 110-140 nm for, for example, 40 nm technology node. Other suitable width dimensions for the openings 364 may also be useful, depending on design requirements or technology node.

An exposure source which includes, for example, a higher wavelength excimer laser may be used as the radiation source to selectively expose the OD layer through a reticle. In one embodiment, the exposure source includes KrF excimer laser. Other suitable types of exposure source may also be used. The OD layer is then developed, transferring the pattern of the reticle, forming openings 364 corresponding to locations where the silicide block layer are to be removed. The openings 364 expose, for example, portions of the silicide block layer above the contact regions below, such as but not limited to portions of the silicide block layer above the sources and drains of the memory cells. Other suitable techniques may be used to remove the exposed OD layer.

Figure 3E:
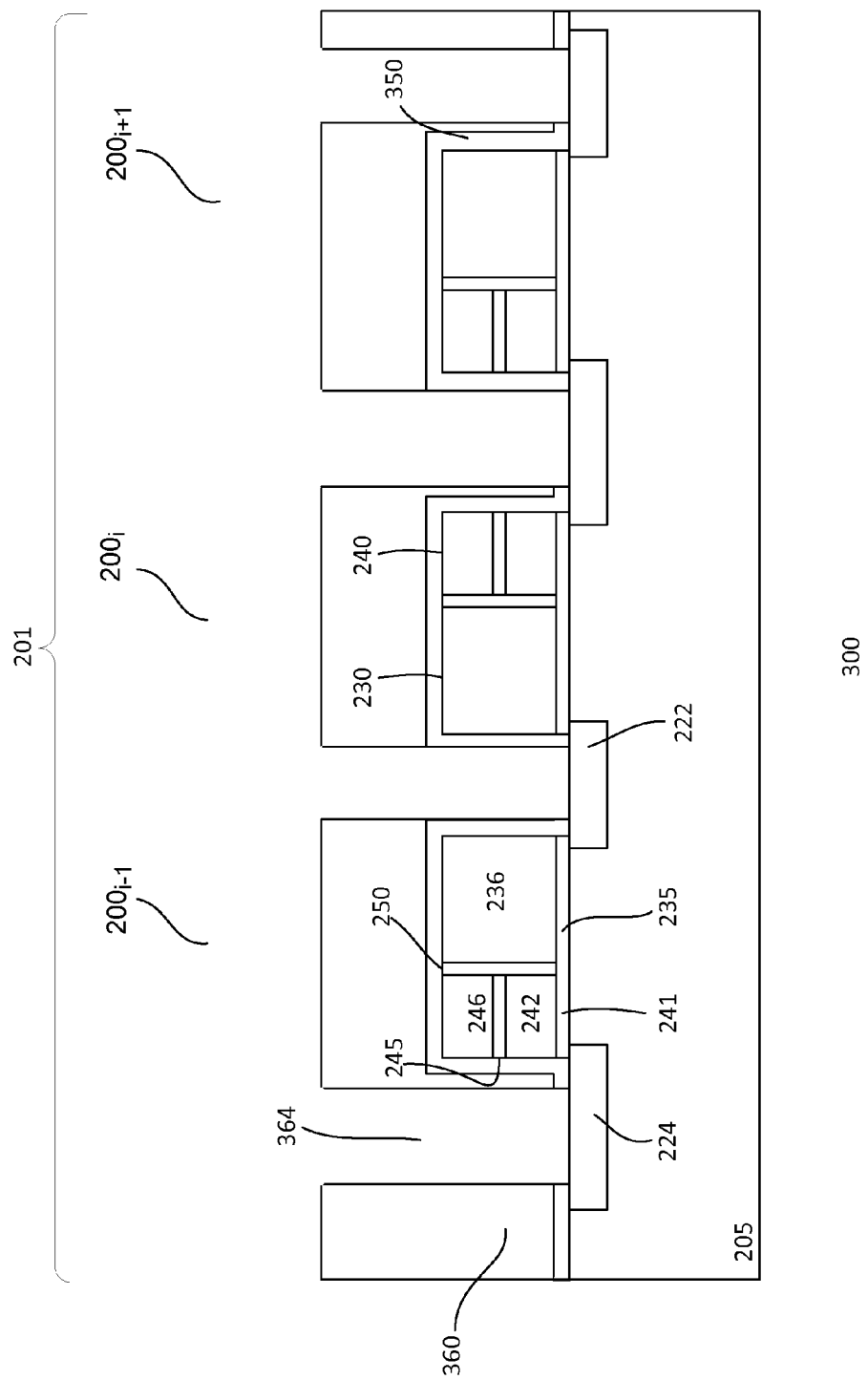

The process continues to remove the exposed portions of the silicide block layer 350 above the contact regions. The silicide block open or removal process may include a dry or wet etch. Other techniques for opening or removing the exposed portions of the silicide block layer may also be useful. The removal of the portions of the silicide block layer exposes portions of the underlying contact regions as shown in FIG. 3e.

In one embodiment, the openings 364 are smaller than the separation distances of adjacent memory cells. This ensures that the subsequently formed metal silicide contacts do not bridge the doped regions and gates. The separation distances of the source and drain regions may be different. For example, the separation of adjacent memory cells for the source region may be about 190 nm while the separation of adjacent memory cells for the drain region may be about 240 nm for, for example, 40 nm technology node. Other suitable separation distances between adjacent memory cells may also be useful. The separation distance, for example, depends on cell design requirements, operation voltage and technology node. The size of the openings may take into account of a mask overlay margin and contact overlay margin. The mask overlay margin, for example, may be about 30-35 nm. For smaller separation distances, the overlay margin may be larger while for larger distances, the overlay margin may be smaller. For example, the mask overlay margin for the source region may be about ±35 nm while the drain region may be about ±30 nm. Other overlay margins may also be useful. For example, the overlay margin may depend on process conditions. The overlay margin ensures no shorting of the doped regions with the gates.

Figure 3F:
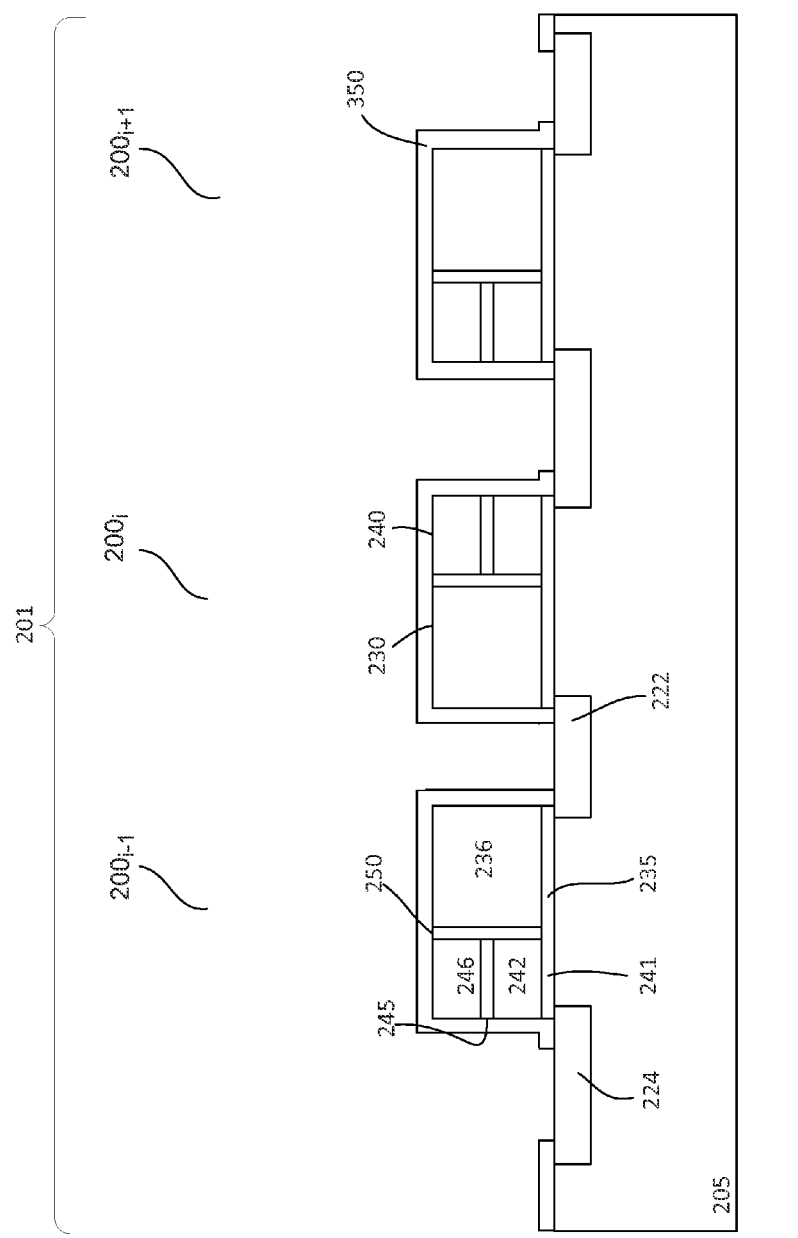

The process continues to remove the remaining OD layer as shown in FIG. 3f. In one embodiment, the remaining OD layer may be removed by, for example, a dry etch or wet clean process. As illustrated in FIG. 3f, the removal of the OD layer exposes the remaining silicide block layer 350.

Figure 3G:
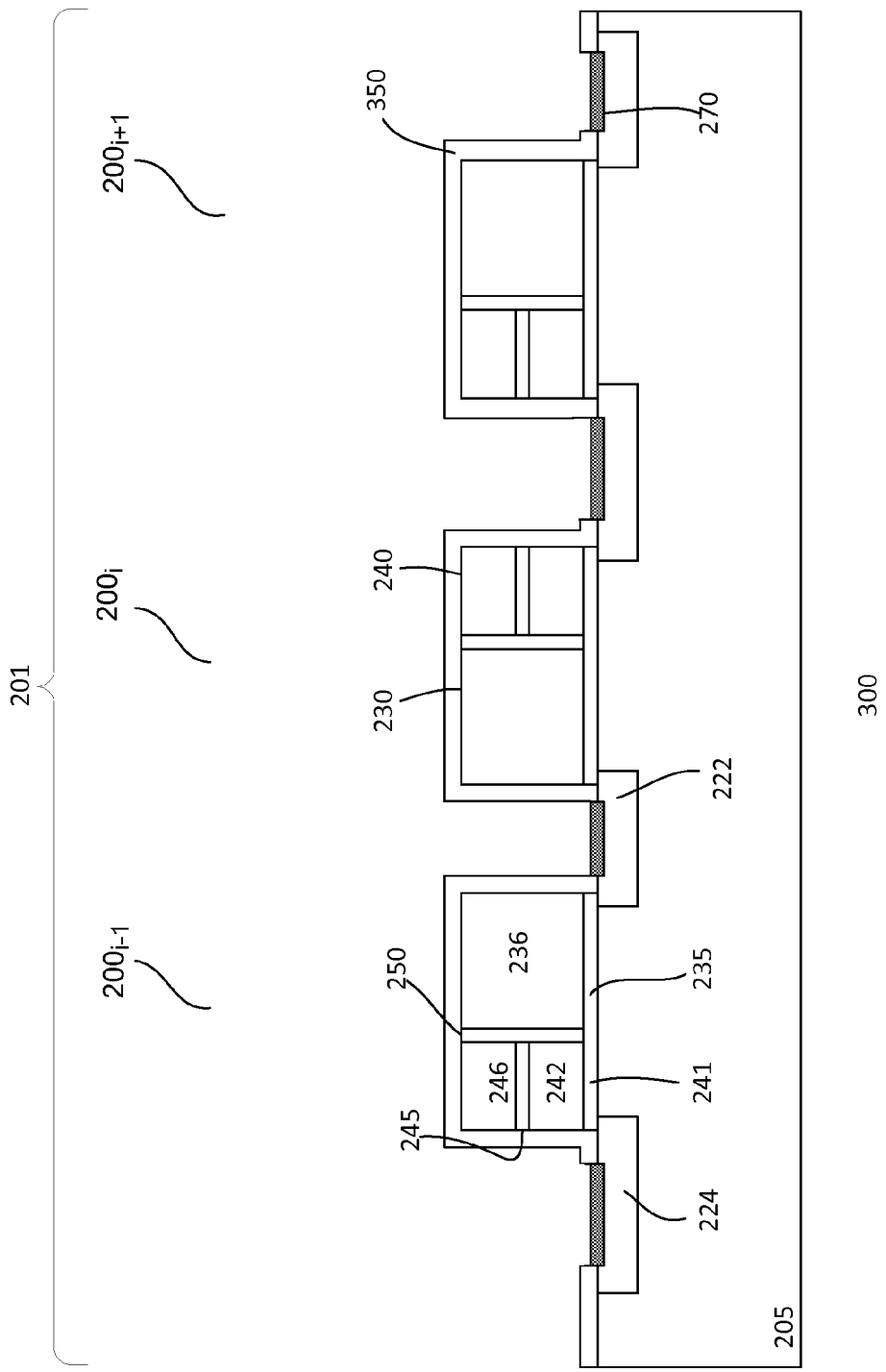

Referring to FIG. 3g, metal silicide contacts 270 are formed on, for example, exposed portions of the contact regions, such as the source and drain regions. In one embodiment, metal silicide contacts are also formed over the MG 240 and SG 230 at, for example, the edge of the cell which have sufficiently wide area of which shorting of adjacent contacts are less likely to occur. As such, silicide contacts over the gates are not shown within the cell area in this cross-sectional view of FIG. 3g. However, it is understood that silicide contacts may also be provided over the gates within the cell area, depending on circuit routine design. In such cases, the OD layer may be modified to include openings which expose, for example, portions of the silicide block layer above the MG 240 and SG 230.

In FIG. 3g, the silicide contacts 270, for example, may be nickel-based silicide contacts. Other types of metal-based silicide contacts, such as titanium or cobalt-based silicide contacts, may also be useful. Due to the overlay margin, the silicide contacts are displaced from the adjacent gates. For example, the silicide contacts are displaced from sides of gates of the split gates. The displacement from sides of gates should be sufficient to prevent bridging with the gates. In one embodiment, the displacement distance Ds is about 0.5 to 2 times the contact dimension. For example, for a contact dimension of about 60 nm, the displacement distance may range from about 30 to 120 nm. Preferably, the displacement distance Ds, for example, is about 1.5 times the contact dimension. For example, longer displacement distance Ds may be applicable for high voltage operation. Providing other displacement distances may also be useful, depending on the technology node, design and operation requirements.

In one embodiment, metal silicide contacts are formed by depositing a metal layer on the substrate. An anneal is performed to cause a reaction with exposed portions of the doped regions which are not covered by the silicide block layer. The reaction forms metal silicide contacts on the exposed portions of the doped region. Although silicide is used, other types of contacts may also be used, depending on the type of substrate. For example, in the case of Si—Ge substrate, the contacts are metal germanocide contacts. Other suitable types of metal silicide or germanocide may also be useful. Unreacted metal are selectively removed, leaving the metal-based contacts on the exposed portions of the doped regions. Removing unreacted metal may be achieved using, for example, a wet etch. Other techniques for removing the unreacted metal may also be useful.

Figure 3H:
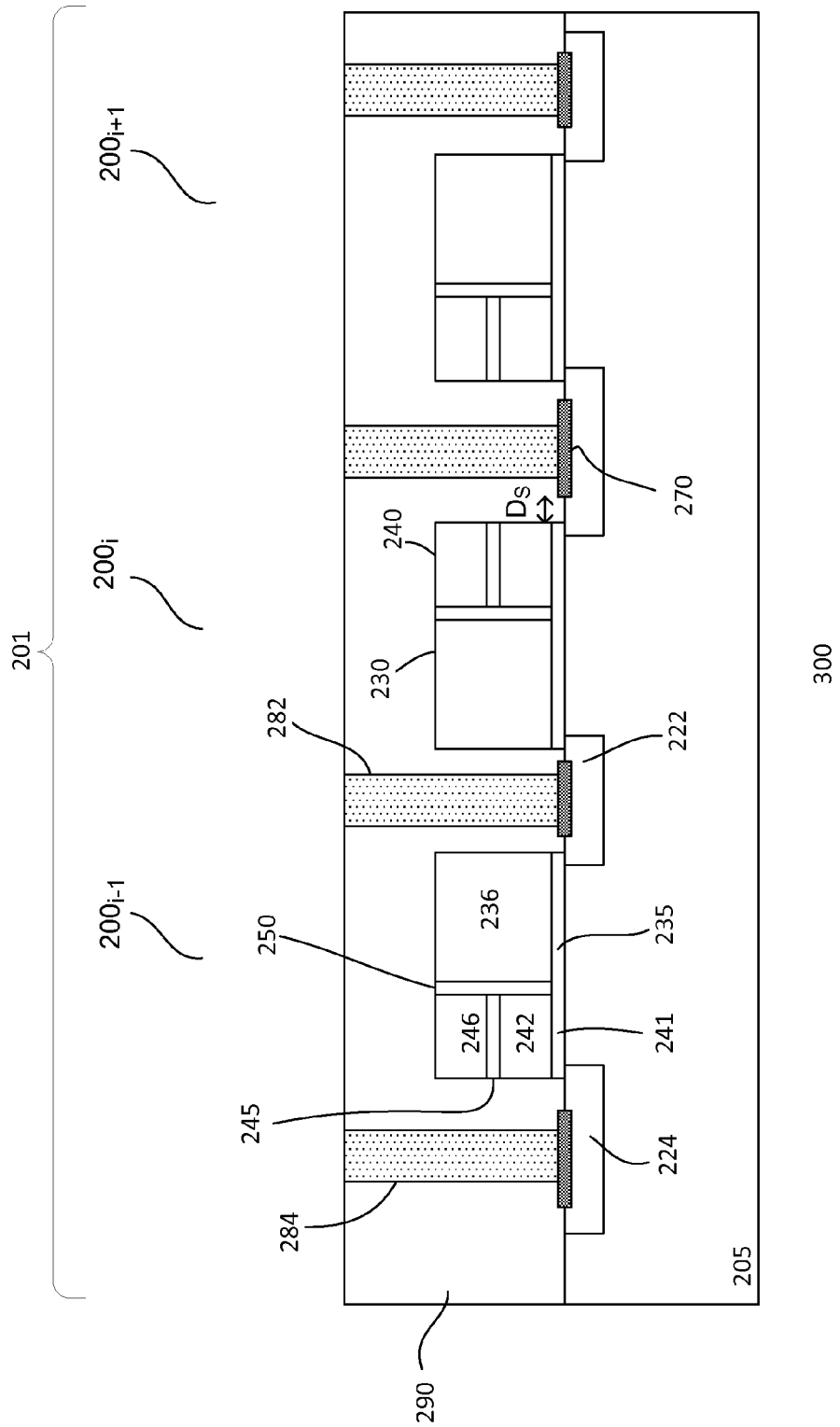

In one embodiment, the remaining silicide block layer 350 may be removed after formation of the silicide contacts as shown in FIG. 3h. The remaining silicide block layer may be removed by, for example, a dry etch or wet clean process. Other techniques may also be employed. In other embodiments, the remaining silicide block layer is not removed and remains during further processing steps.

Referring to FIG. 3h, a dielectric layer 290 is formed over the substrate, covering the memory cells. The dielectric layer, for example, is a silicon oxide layer. Other types of dielectric materials including BPSG, PSG, USG, TEOS oxide, PEOX, HDP oxide, etc., may also be useful. The dielectric layer serves as a contact or pre-metal dielectric layer in which contacts are formed to contact regions of the substrate. The contacts, for example, are tungsten contacts. Other types of conductive contacts may also be useful.

To form contacts, a soft mask (not shown) may be used to form via or contact openings to the contact regions. The soft mask, for example, is a photoresist mask. To improve lithographic resolution, an anti-reflective coating (ARC) may be provided between the dielectric layer and soft mask. The soft mask is patterned to form openings corresponding to the contact regions. A conductive layer is then formed on the substrate, filling the openings and covering the dielectric layer 290. A planarizing process, such as CMP, removes excess conductive layer, forming contacts having a planar surface with the top surface of the dielectric layer. Other techniques for forming contacts may also be useful.

In one embodiment, the contact mask openings are smaller than the separation distances of adjacent memory cells. This ensures that the subsequently formed contacts do not bridge the doped regions and gates. As described above, the separation distances of the source and drain regions may be different. The separation distance, for example, depends on cell design requirements, operation voltage and technology node. The size of the contact openings may take into account of a contact mask overlay margin. The contact mask overlay margin, for example, may be about 20-40 nm. For smaller separation distances, the contact mask overlay margin may be larger while for larger distances, the contact mask overlay margin may be smaller. For example, the contact mask overlay margins for the source region may be about ±20 nm while the drain region may be about ±40 nm. Other overlay margins may also be useful. For example, the overlay margin may depend on process conditions. The overlay margin ensures no shorting of the doped regions with the gates.

In one embodiment, SL contacts 282 and BL contacts 284 are formed. The SL contacts are formed in the dielectric layer in communication with the metal silicide contacts on the source or first doped regions; the BL contacts are form in the dielectric layer in communication with the metal silicide contacts on the drain or second doped regions. Additionally, WL contacts (not shown) are coupled to the select gates and CGL contacts (not shown) are coupled to the CGs.

The BL contacts are coupled to BLs, SL contacts are coupled to SLs, WL contacts are coupled to WLs and CGL contacts are coupled to CGLs. The various lines are disposed in one or more metal levels above the contact level. For example, BLs and SLs are disposed on one metal level while the WLs and CGLs are disposed on another metal level. The BLs and SLs run, for example, along the column direction while WLs and CGLs run along a row direction. Other configurations of gate lines may also be useful.

The embodiment with respect to FIGS. 3a-3h, as described, is suitable for features having larger critical dimension, such as but not limited to 0.11 µm or larger according to a design rule. The embodiment with respect to FIGS. 3a-3h results in advantages. For example, by providing the silicide contacts as described above, contact resistance is advantageously reduced without the risk of shorting the doped regions and gates. In addition, the silicide contacts as described eliminate SG to CG bridging concern. Furthermore, resistance reduction is achieved with larger contact dimension without increasing the surface area of the cell. The process as described offers a simplified and cost effective solution for producing improved and more reliable devices. Although embodiments are described above is suitable for use in, for example, forming features with larger design dimensions according to a design rule, it is understood that the embodiment as described with respect to FIGS. 3a-3h is not limited as such. It is suitable for use in any case of which shorting between adjacent features or elements is a risk.

Figure 4A:
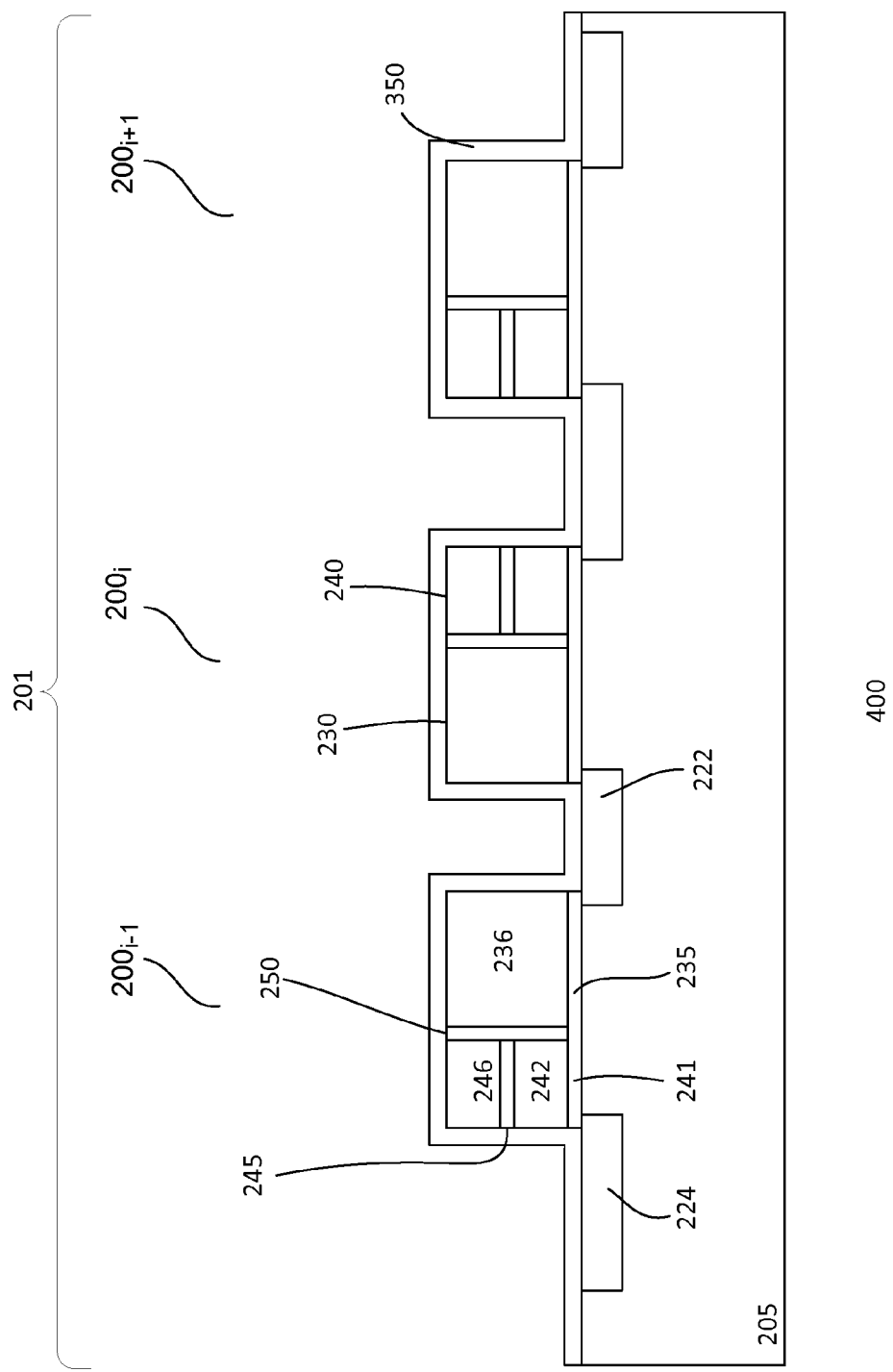
FIGS. 4a-4h show cross-sectional views of another embodiment of a process for forming a device.

FIGS. 4a-4h show an embodiment of a process 400 for forming a device. The device is similar to that described in FIGS. 1a-b and 2. Common elements may not be described or described in detail. The process includes similar process steps as that described in FIGS. 3a-3h. As such, common process steps may not be described or described in detail. Referring to FIG. 4a, a partially processed substrate is provided. The partially processed substrate is at the same stage as that described in FIG. 3b. For example, a silicide block layer 350 is formed over the device region 201 of the substrate, covering the gates as well as the surfaces of the doped regions. The materials and features of the partially processed device are the same as that described in FIG. 3b. As such, common elements may not be described or described in detail.

Figure 4B:
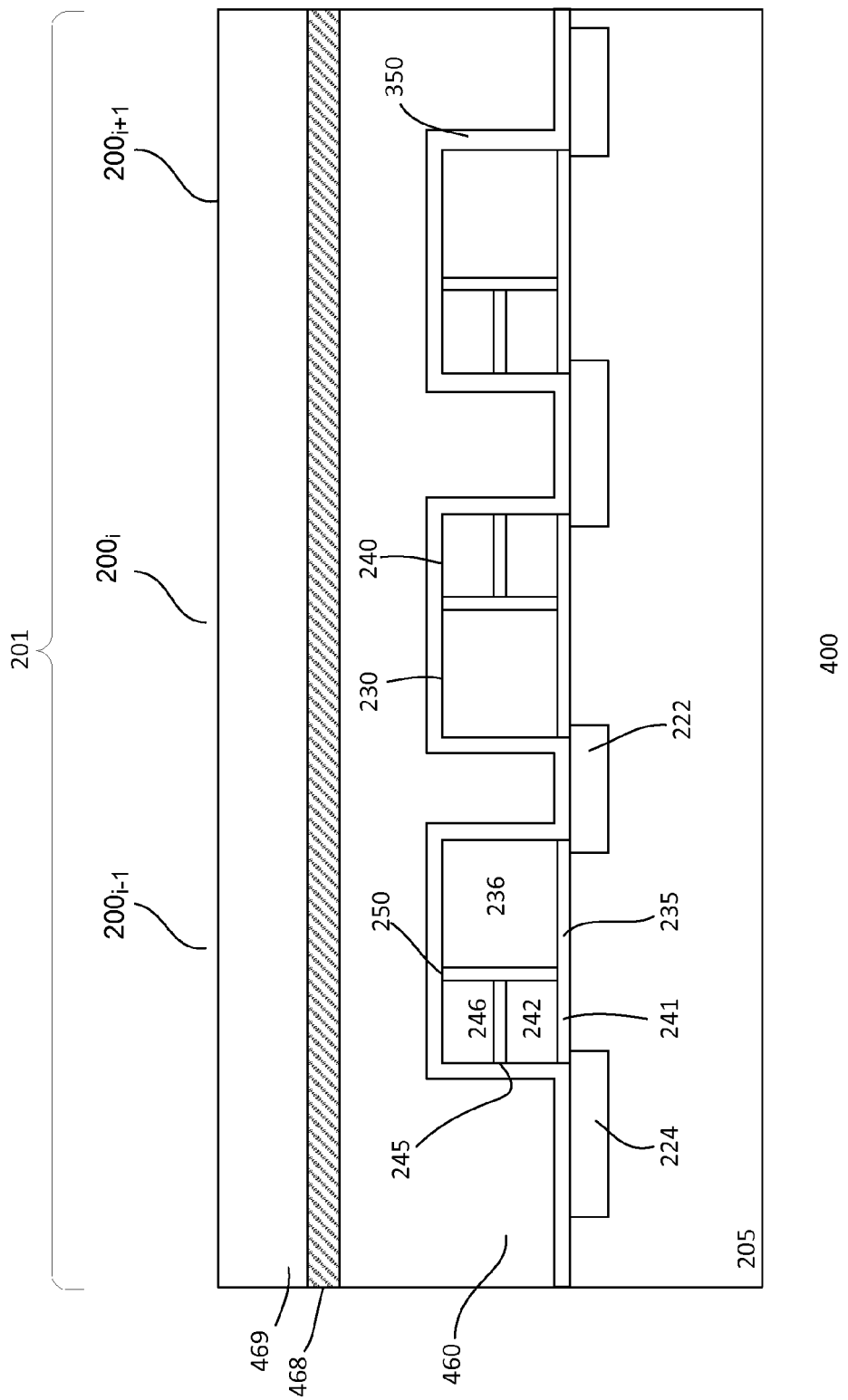

The process continues to form a first dielectric or resist layer 460 over the substrate as shown in FIG. 4b. In one embodiment, the process continues to form an optical dispersive (OD) layer 460 using any suitable techniques, such as but not limited to spin-on technique. The OD layer, for example, may include the same material as the OD layer 360 as already described in FIG. 3b. Other suitable types of materials may also be used as the first resist layer 460. The OD layer sufficiently covers the silicide block layer and the memory cells. The OD layer, for example, includes a thickness $T_2$ which is about 1.5-2 times the height of FG. The thickness of the OD layer may be thinner or thicker than 1.5-2 times the height of FG. Other suitable thickness ranges may also be useful, so long as the OD layer is sufficiently thick to cover high step height array topography.

Referring to FIG. 4b, a second resist or soft mask layer is 469 is formed on the substrate over the first resist layer 460. The second resist layer 469, for example, includes a photoresist. The second resist layer 469, in one embodiment, includes materials suitable for low wavelength exposure source. Other suitable types of material may also be useful. In FIG. 4b, a hard mask 468 is provided in between the second resist layer 469 and OD layer 460. In one embodiment, the hard mask 468 includes any suitable material with high etch selectivity to the underlying OD layer 460. The hard mask 468, in one embodiment, includes a silicon anti-reflective coating (SiARC), carbon material, etc. The hard mask 468 and OD layer, for example, can be made of organic or inorganic material, including $SiO_2$, $SiON$, $Si_3N_4$, C, PR, etc., depending on etch selectivity. The hard mask 468 also serves as a protective layer to protect the underlying OD layer during patterning of the second resist or soft mask layer 469.

Figure 4C:
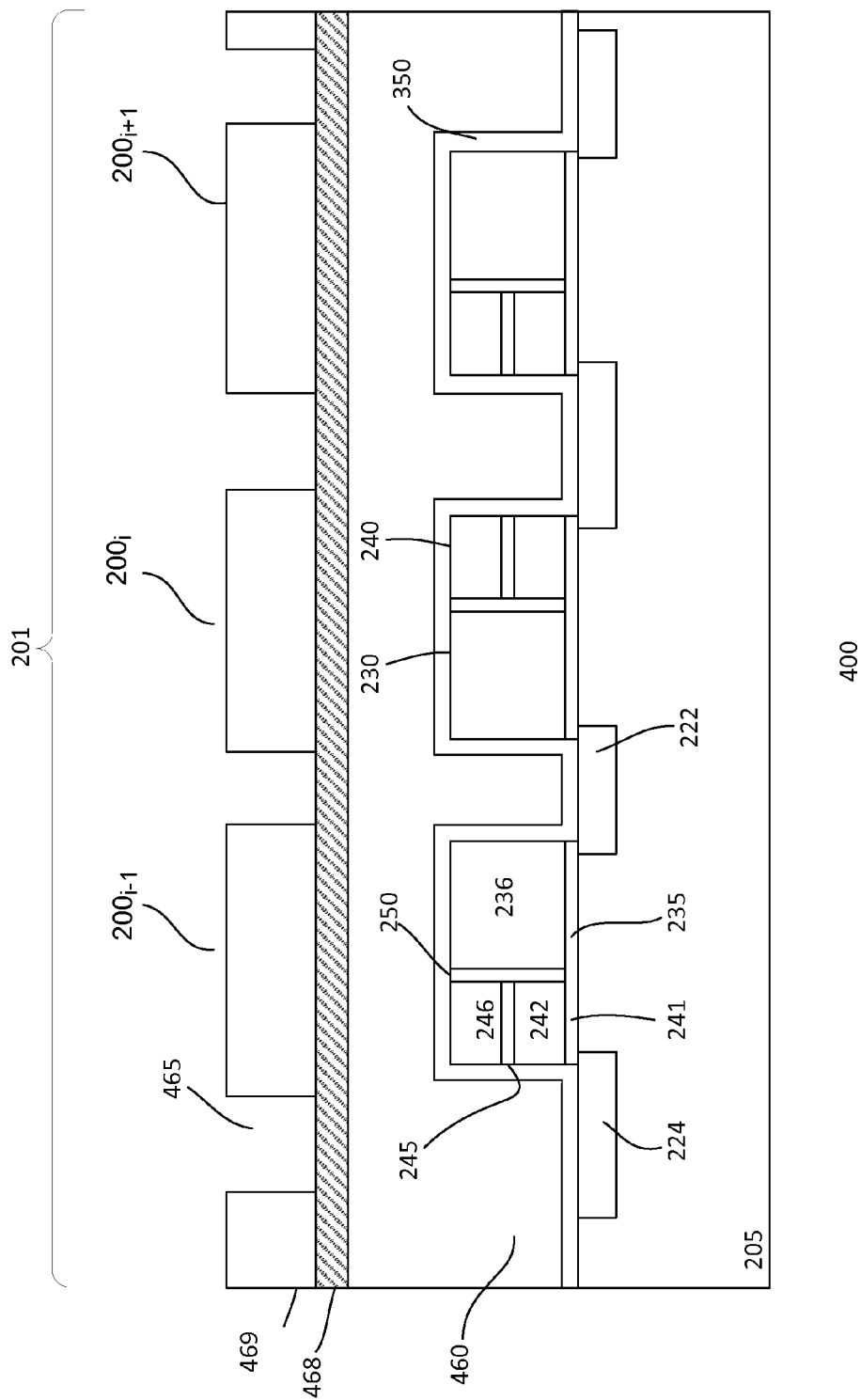

In FIG. 4c, the mask layer 469 is patterned to form openings 465. The openings correspond to, for example, doped regions of the memory cells. In one embodiment, the opening may be a block opening, traversing a column of memory cells. Also, the opening may expose the non-array region of the device. For example, the opening may expose the logic or low voltage device region of the device.

An exposure source which includes, for example, a lower wavelength excimer laser may be used as the radiation source to expose the second resist 469 through a reticle. In one embodiment, the exposure source includes ArF excimer laser. Other suitable types of exposure source may also be used. The second resist layer is then developed, transferring the pattern of the reticle, forming a patterned resist layer. The openings 465 expose, for example, portions of the hard mask 468 below.

Figure 4D:
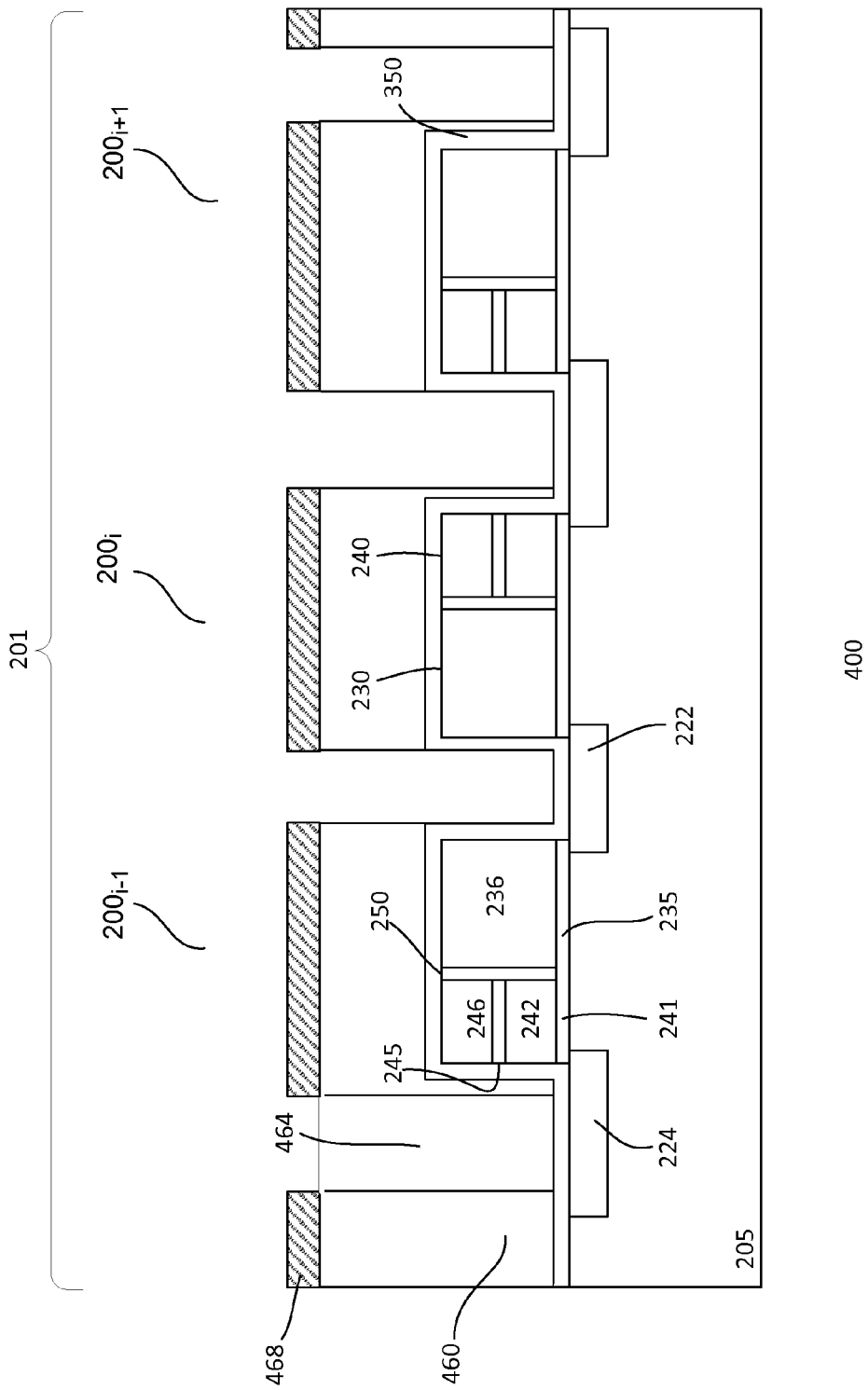

The second resist layer 469 is then used to pattern the hard mask 468 and OD layer 460, as shown in FIG. 4d. Portions of the hard mask and OD layer unprotected by the second resist layer 469 may be removed by, for example, a dry etch process. For example, an anisotropic etch, such as reactive ion etch (RIE), is performed. The etch process may include first and second etches. For example, the first etch process selectively removes the hard mask layer while the second etch removes the OD layer 460 which is unprotected by the hard mask. This forms openings 464, exposing portions of the silicide block layer 350 above the contact regions, such as the portions of the silicide block layer above the sources and drains of the memory cells. Other suitable techniques for removing the hard mask and OD layer may also be useful. The second resist layer 469, for example, may be consumed or removed during the removal of the exposed hard mask and OD layer.

Figure 4E:
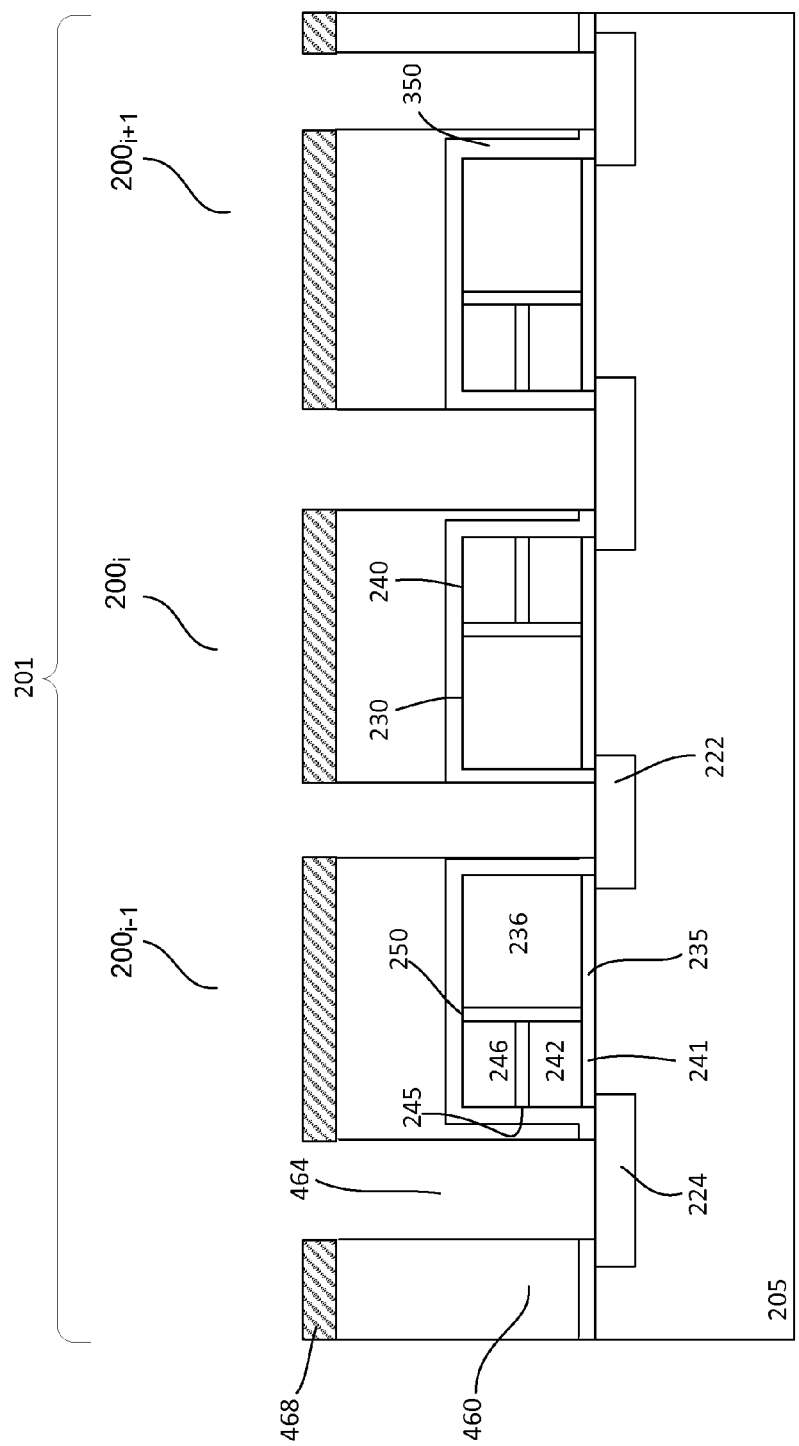

The process continues to remove the exposed portions of the silicide block layer 350 above the contact regions. The silicide block open or removal process may include a dry or wet etch. Other techniques for opening or removing the exposed portions of the silicide block layer may also be useful. The removal of the portions of the silicide block layer exposes, for example, portions of the underlying contact or doped regions as shown in FIG. 4e.

In one embodiment, the soft mask openings 465 are smaller than the separation distances of adjacent memory cells. This ensures that the subsequently formed metal silicide contacts do not bridge the doped regions and gates. The separation distances of the source and drain regions may be different. For example, the separation distance of adjacent memory cells for the source region may be about 190 nm while the separation distance of adjacent memory cells for the drain region may be about 240 nm for, for example, 40 nm technology node. Other separation distances between adjacent memory cells may also be useful. The separation distance, for example, depends on cell design requirements, operation voltage and technology node. The size of the openings may take into account of a mask overlay margin and contact overlay margin. The mask overlay margin, for example, may be about 30-35 nm. For smaller separation distances, the overlay margin may be larger while for larger distances, the overlay margin may be smaller. For example, the mask overlay margin for the source region may be about ±35 nm while the drain region may be about ±30 nm. Other overlay margins may also be useful. For example, the overlay margin may depend on process margin and circuit design conditions. The overlay margin ensures no shorting of the doped regions with the gates.

Figure 4F:
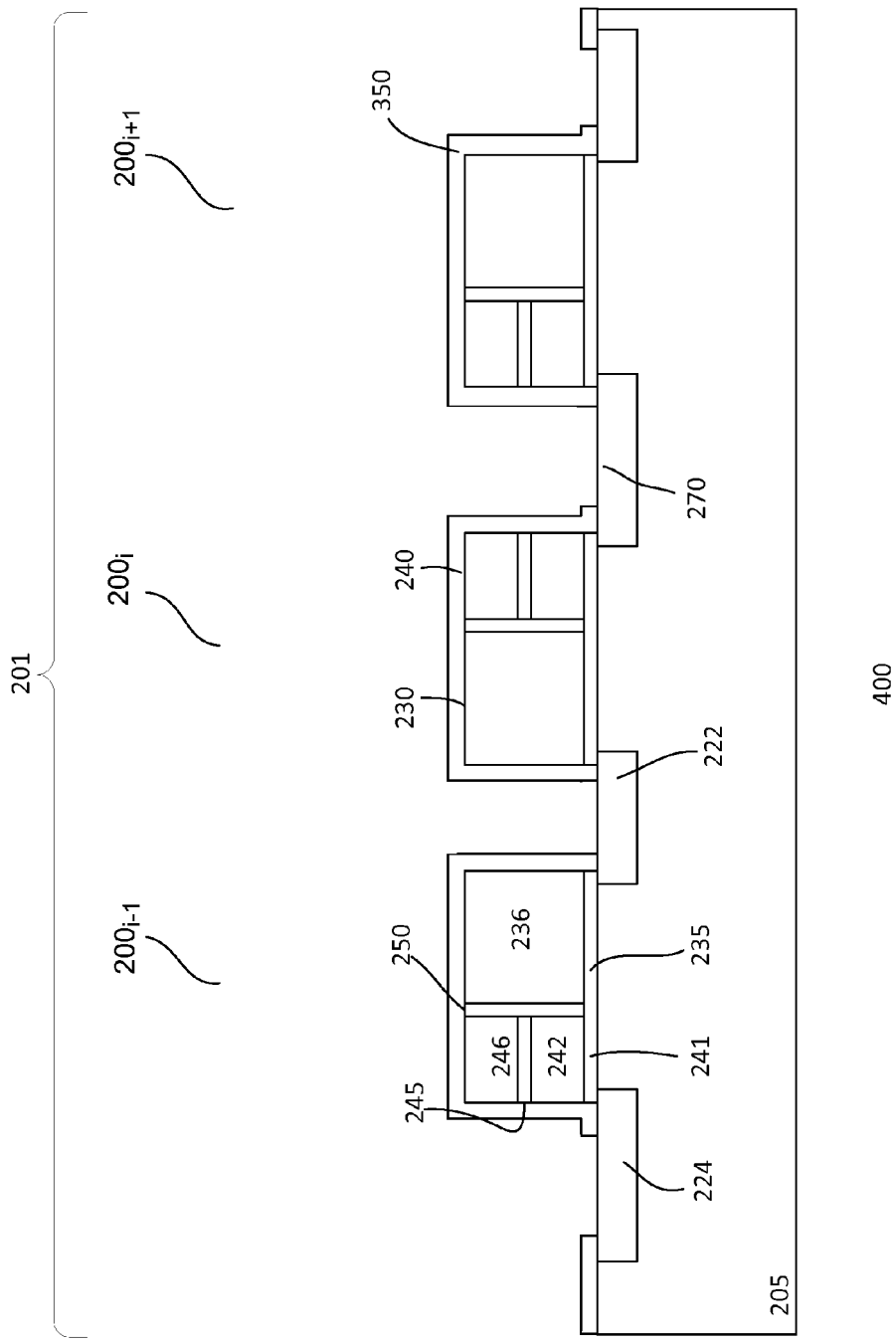

The process continues to remove the remaining hard mask and OD layer as shown in FIG. 4f. In one embodiment, the remaining hard mask and OD layer may be removed by, for example, a dry etch or wet clean process. Other suitable techniques may also be employed to remove these layers. As illustrated in FIG. 4f, the removal of the hard mask and OD layer exposes the remaining silicide block layer 350.

Figure 4G:
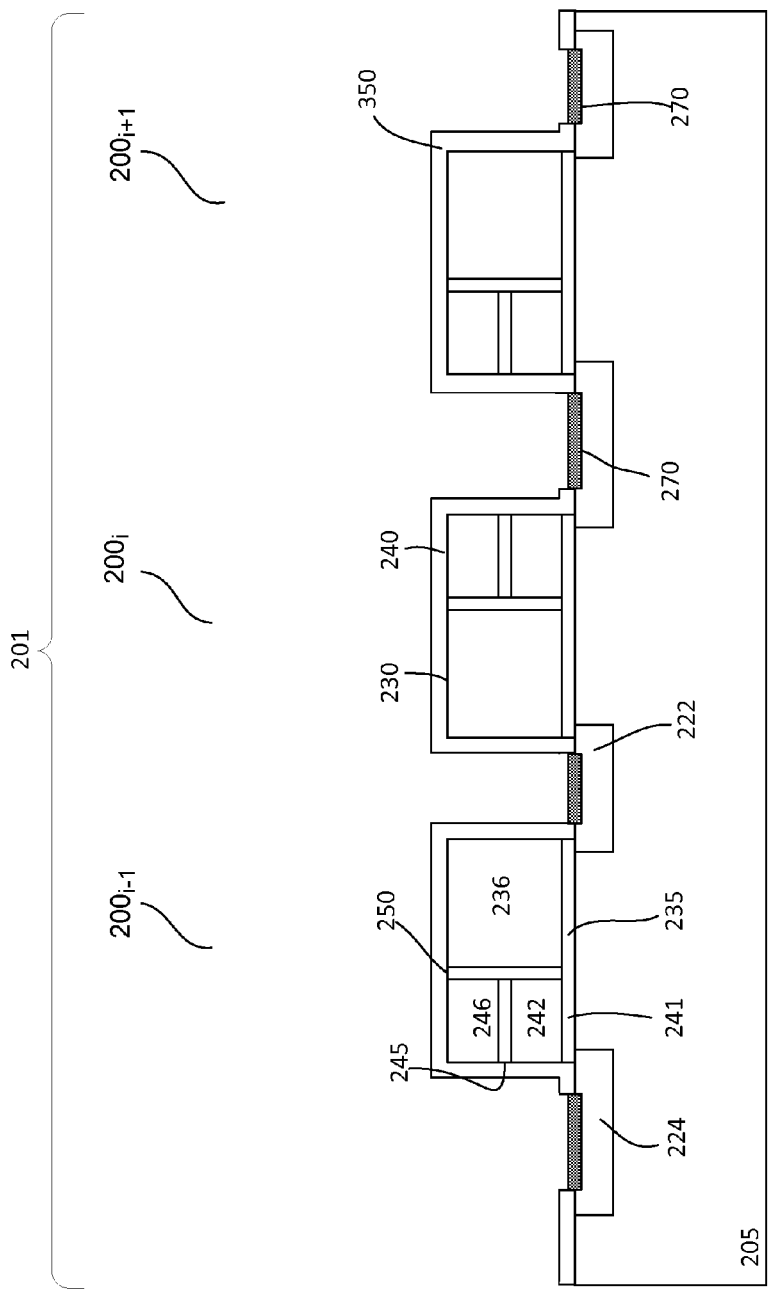
Figure 4H:
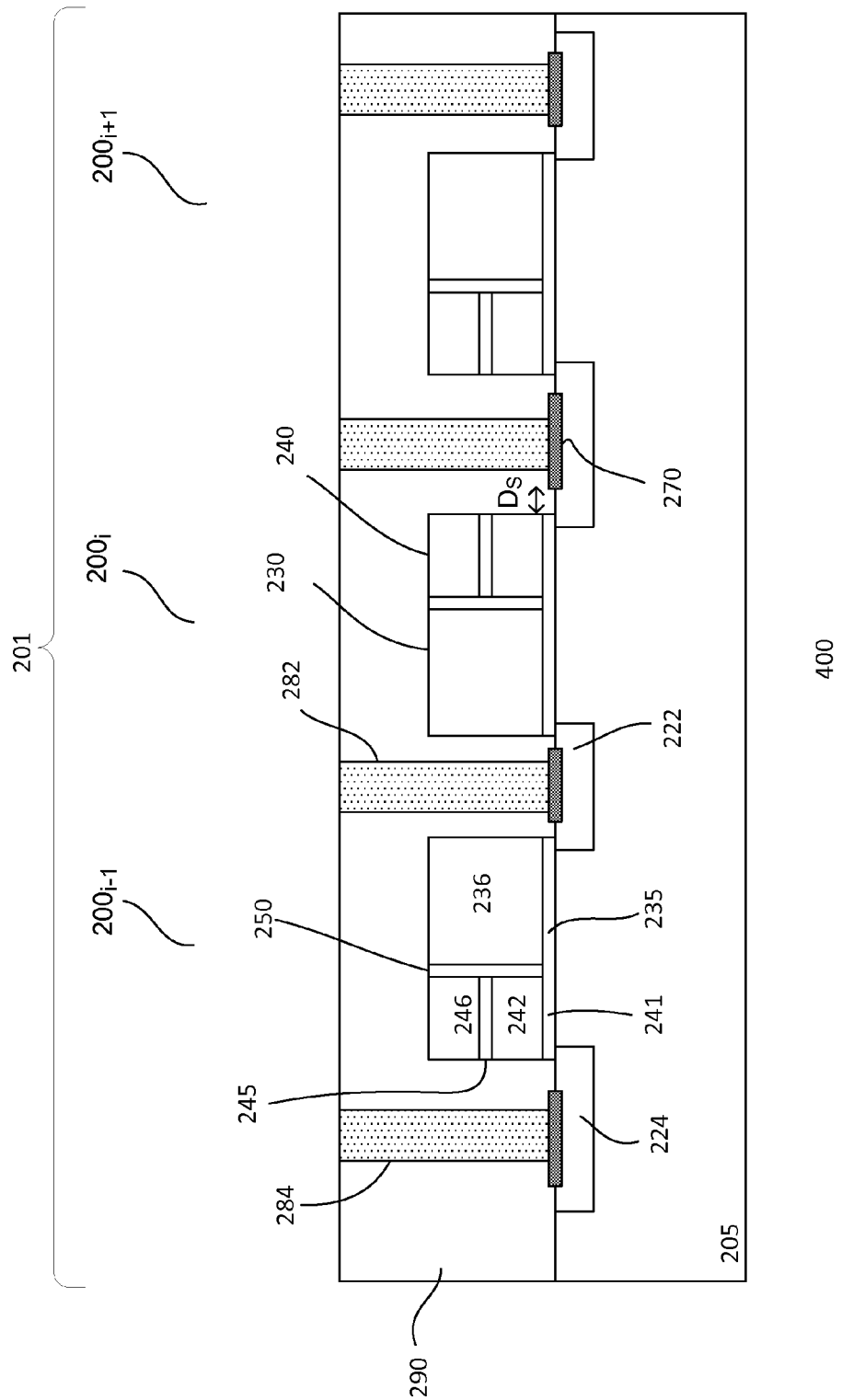

The process continues to form metal silicide contacts 270 over exposed portions of the source and drain regions as shown in FIG. 4g and to form interlayer dielectric layer 290, SL and BL contacts 282 and 284 as shown in FIG. 4h. The techniques for forming the metal silicide contacts, interlayer dielectric layer and SL and BL contacts are similar to that described from FIG. 3g to FIG. 3h above. As such, a device such as that shown in FIG. 2 is formed. In one embodiment, metal silicide contacts are also formed over the MG 240 and SG 230 at, for example, the edge of the cell which have sufficiently wide area of which shorting of adjacent contacts are less likely to occur. As such, silicide contacts over the gates are not shown within the cell area in the cross-sectional view. However, it is understood that silicide contacts may also be provided over the gates within the cell area, depending on circuit routine design. In such cases, the second resist, hard mask and first resist or OD layers may be modified to include openings which expose, for example, portions of the silicide block layer above the MG 240 and SG 230.

The embodiment with respect to FIGS. 4*a*-4*h*, as described, is suitable for features having smaller critical dimension, such as but not limited to 0.12 μm or smaller according to a design rule. For example, it is useful for features having critical dimension which is 0.10 μm or smaller according to a design rule. The embodiment as described with respect to FIGS. 4*a*-4*h* is flexible and may also be suitable for features having larger critical dimensions. This embodiment includes some or all advantages as described with respect to FIGS. 3*a*-3*h* above. As such, these advantages will not be described or described in detail.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate prepared with at least a first transistor and a second transistor, each of the first and second transistors having a gate disposed on the substrate between first and second heavily doped source/drain (S/D) regions in the substrate, wherein the heavily doped S/D regions are disposed adjacent to first and second sides of the gate and partially underlaps the gate;
   forming a silicide block layer on the substrate, wherein the silicide block layer covers and in direct contact with the first and second sides and top surface of the gate and the first and second heavily doped S/D regions;
   patterning the silicide block layer to expose portions of the first and second heavily doped S/D regions of the first and second transistors;
   forming silicide contacts in the exposed portions of the first and second heavily doped S/D regions, wherein the patterned silicide block layer is in direct contact with sides and top surface of the gates when the silicide contacts are formed and the silicide contacts are displaced from the sides of the gates and sides of the first and second heavily doped S/D regions of the first and second transistors;
   forming a contact dielectric layer covering the at least first and second transistors: and
   forming contacts in the contact dielectric layer, wherein the contacts are in communication with the silicide contacts in the heavily doped S/D regions.

2. The method of claim 1 comprising:
   forming a resist layer over and in direct contact with the silicide block layer prior to patterning the silicide block layer; and
   patterning the resist layer to form openings corresponding to the first and second heavily doped S/D regions.

3. The method of claim 2 wherein:
   the resist layer comprises an optical dispersive (OD) layer; and
   the silicide block layer comprises nitride, oxide, oxynitride or a combination thereof.

4. The method of claim 3 wherein:
   the first and second transistors comprise first and second split gate transistors, each of the split gate transistors comprises a select gate having a select gate electrode over a select gate dielectric, and a memory gate having a control gate stacked over a floating gate.

5. The method of claim 3 wherein patterning the resist layer comprises using a high wavelength excimer laser as a radiation source to expose the resist layer.

6. The method of claim 5 wherein the high wavelength excimer laser comprises KrF excimer laser.

7. The method of claim 5 comprising:
   removing the resist layer after patterning the silicide block layer;
   removing the silicide block layer after forming the silicide contacts; and wherein
   the contact dielectric layer is in direct contact with the first and second sides and top surface of the gate of the first and second transistors after removing the silicide block layer.

8. The method of clam 3 wherein the first and second transistors comprise first and second split gate transistors, each of the split gate transistors comprises a select gate, a memory gate having a control gate stacked over a floating gate, and a gate spacer disposed between the select gate and memory gate.

9. The method of claim 2 wherein:
   the first and second transistors comprise first and second split gate transistors, each of the split gate transistors comprises a select gate and a memory gate having a control gate stacked over a floating gate; and
   the resist layer includes a thickness of about 1.5-2 times a height of the floating gate.

10. The method of claim 1 wherein displacement distance between the silicide contacts and sides of the gates is about 0.5 to 2 times a dimension of the contact in order to prevent electrical shorts or bridging with adjacent gates.

11. The method of claim 1 comprising:
   forming a first resist layer over the silicide block layer prior to patterning the silicide block layer;
   forming a hard mask layer over the first resist layer;
   forming a second resist layer over the hard mask layer; and
   patterning the second resist layer to form openings corresponding to the first and second heavily doped S/D regions.

12. The method of claim 11 wherein:
   the first resist layer comprises an optical dispersive (OD) layer;
   the hard mask layer comprises a material with high etch selectivity to the underlying OD layer; and
   the silicide block layer comprises nitride, oxide, oxynitride or a combination thereof.

13. The method of claim 12 wherein patterning the second resist layer comprises using a low wavelength excimer laser as a radiation source to expose the second resist layer.

14. The method of claim 13 wherein the low wavelength excimer laser comprises ArF excimer laser.

15. The method of claim 12 comprising:
   removing portions of the hard mask and OD layers unprotected by the second resist layer to expose portions of the silicide block layer above the first and second heavily doped S/D regions.

16. The method of claim 15 comprising:
   removing the hard mask and OD layers after patterning the silicide block layer.

17. A method of forming a device comprising:
   providing a substrate prepared with at least a first transistor wherein the first transistor comprises a gate disposed on the substrate between first and second heavily doped source/drain (S/D) regions in the substrate, wherein the heavily doped S/D regions are disposed adjacent to first and second sides of the gate and partially underlaps the gate;

forming a silicide block layer on the substrate, wherein the silicide block layer covers and in direct contact with the first and second sides and top surface of the gate and the first and second heavily doped S/D regions;

patterning the silicide block layer to expose portions of the heavily doped S/D regions of the first transistor; and forming silicide contacts in the exposed portions of the first and second heavily doped S/D regions, wherein the patterned silicide block layer is in direct contact with sides and top surface of the gates when the silicide contacts are formed and the silicide contacts are displaced from the sides of the gate and sides of the first and second heavily doped S/D regions of the first transistor.

18. The method of claim 17 comprising:

forming a first resist layer over the silicide block layer prior to patterning the silicide block layer;

forming a hard mask layer over the first resist layer;

forming a second resist layer over the hard mask layer; and patterning the second resist layer to form openings corresponding to the first and second heavily doped S/D regions.

19. A device comprising:

a substrate prepared with at least a first transistor and a second transistor, each of the first and second transistors comprises a gate disposed on the substrate between first and second heavily doped source/drain (S/D) regions in the substrate, wherein the heavily doped S/D regions are disposed adjacent to first and second sides of the gate and partially underlaps the gates;

silicide contacts disposed on portions of the first and second heavily doped S/D regions, wherein the silicide contacts are displaced from the first and second sides of the gates and sides of the first and second heavily doped S/D regions of the first and second transistors;

a contact dielectric layer disposed over the substrate covering the transistors, wherein the contact dielectric layer is in direct contact with at least the first and second sides and top surface of the gate of the first and second transistors; and contacts disposed in the contact dielectric layer, wherein the contacts are in communication with the silicide contacts in the heavily doped S/D regions.

20. The device of claim 19 wherein displacement distance between the silicide contacts and sides of the gates is about 0.5 to 2 times a dimension of the contact in order to prevent electrical shorts or bridging with adjacent gates.

21. The method of claim 17 wherein the first transistor comprises a split gate transistor, the split gate transistor comprises a select gate, a memory gate having a control gate stacked over a floating gate, and a gate spacer disposed between the select gate and memory gate.

* * * * *